US006569811B1

United States Patent
Shi

(10) Patent No.: US 6,569,811 B1
(45) Date of Patent: May 27, 2003

(54) ENHANCEMENT OF JC IN OXIDE SUPERCONDUCTORS

(75) Inventor: Douglu Shi, Cincinnati, OH (US)

(73) Assignee: University of Cincinnati, Cincinnati, OH (US)

( * ) Notice: Subject to any disclaimer, the term of this patent is extended or adjusted under 35 U.S.C. 154(b) by 0 days.

(21) Appl. No.: 09/445,357

(22) PCT Filed: Jun. 8, 1998

(86) PCT No.: PCT/US98/11318

§ 371 (c)(1),
(2), (4) Date: Mar. 14, 2000

(87) PCT Pub. No.: WO98/57382

PCT Pub. Date: Dec. 17, 1998

(51) Int. Cl.$^7$ .......................... H01B 12/00; H01L 39/24
(52) U.S. Cl. ...................... 505/400; 505/450; 505/727
(58) Field of Search ................... 505/234, 236, 505/400, 450, 727, 785

(56) References Cited

U.S. PATENT DOCUMENTS

| | | |
|---|---|---|
| 3,615,881 A | 10/1971 | Greene |
| 5,308,800 A | 5/1994 | Wehrle et al. |
| 5,340,794 A | 8/1994 | Tallon et al. |
| 5,399,547 A | 3/1995 | Negm et al. |
| 5,428,005 A * | 6/1995 | Matsuura et al. ........... 505/234 |
| 5,430,008 A | 7/1995 | Morris |
| 5,929,001 A * | 7/1999 | Goretta et al. .............. 505/490 |
| 5,958,842 A * | 9/1999 | Holesinger et al. ......... 505/450 |

FOREIGN PATENT DOCUMENTS

| | | | |
|---|---|---|---|
| EP | 553593 B1 | 5/1996 | |
| JP | 02237179 | 9/1990 | |
| WO | WO 98/57382 | * 12/1998 | |

OTHER PUBLICATIONS

Togano, K., et al. *"Fabrication of bismuth strontium calcium copper oxide/silver composite Superconductors by Dip–Coating Process,"* Adv. Cryog. Eng., 38/Pt.B, 1992.

Shi, Donglu, *"Properties and Defects of Type II Superconductors,"* MRS Bull., 16/12, pp. 37–41, 1991.

Balachandran, U., et al., *"Recent Issues in Fabrication of High–T Magnets and Long–Length Multifilament Conductors,"* Applied Superconductivity, vol. 2, No. 3/4, pp. 251–250, 1994.

Gray, K.E., *"The Effects of Anisotrophy on the Vortex Dynamics and Transport Dissipation in Bi–Sr–Ca–Cu–O Compounds,"* Applied Superconductivity, vol. 2, No. 3/4, pp. 295–304, 1994.

Singh, J.P., et al., *"Mechanical and superconducting properties of sintered composite $Yba_2Cu_3O_{7-8}$ tape on a silver substrate,"* Appl. Phys. Lett. 53(3), Jul. 18, 1988.

Shi, Donglu, et al., *"110 K Superconductivity in Crystallized Bi–Sr–Ca–Cu–O Glasses,"* Physica C 156, pp. 822–826, 1988.

* cited by examiner

*Primary Examiner*—Mark Kopec
(74) *Attorney, Agent, or Firm*—Frost Brown Todd LLC

(57) ABSTRACT

The present invention comprises novel materials comprising composite high-Tc superconductors which contain a dispersion of precipitates and structural defects and thereby exhibit enhanced flux pinning and enhanced critical current in the superconducting state, and novel nanophase orientation processes for their preparation.

8 Claims, 8 Drawing Sheets

ENHANCEMENT OF JC IN OXIDE SUPERCONDUCTORS

FIELD OF THE INVENTION

The present invention comprises novel nanophase orientation methods for the preparation of composite high-Tc superconductors which contain a dispersion of nanophases and thereby exhibit enhanced flux pinning and enhanced critical current in the superconducting state. The present invention also comprises novel composite high-Tc superconductors prepared by such methods.

BACKGROUND OF THE INVENTION

Superconductivity, ever since its discovery in 1911, has demonstrated enormous potential in industrial applications including nuclear magnetic resonance (NMR), magnetic levitation and propulsion, alternating and direct current power transmission, light weight generators, magnetic fission, high-field coils, and energy storage (Z. J. J. Stekly and E. Gregory, Chapter on Applications of A-15 S. C., "Intermetallic Compounds, Principles and Practices," eds. J. H. Westbrook and R. L. Fleisher, J. Wiley & Sons, New York (1994)). All these applications have so far used the low-Tc superconductors (LTS) such as NbTi and NbSn, which are two commercially available compounds (D. Shi, "Properties and Defects of Type II Superconductors," MRS Bulletin Vol. XVI, 37 (1991); Z. J. J. Stekly and E. Gregory, "High Temperature Superconducting Materials Science and Engineering," (ed. D. Shi Pergamon, Oxford) p. 444, 1995). Although LTS materials offer unique properties, certain factors limit their usefulness in practice such as low Jc at high fields, brittleness, and an extremely low operating temperature at 4.2° K. These factors have contributed to the fact that, despite the intensive efforts, superconductors have not become common in industry.

Theoretical and experimental research in the field of superconducting materials by thousands of researchers has led to the discovery of a variety of oxide compounds which become superconducting at relatively high critical temperatures (Tc), i.e., above about 20°K. The widely known high temperature superconductors are oxides, and presently contain (1) copper and/or bismuth, (2) barium or other alkaline earths such as strontium or calcium, and (3) trivalent elements such as yttrium. Rare earth elements having atomic numbers ranging from 57 to 71 (lanthanum to lutetium), are substituted for yttrium in some materials, as are thallium or bismuth.

In 1986, a series of high temperature superconductors ("HTS") including $YBa_2Cu_3Ox$ (123) and Bi—Sr—Ca—Cu—O (BSCCO) were discovered with the Tc values exceeding 77 K (J. G. Bednorz and K. A. Mueller, Phys. Rev. B, 64 189 (1986); K. Wu et al., Phys. Rev. Lett. 58 908 (1987); H. Maeda, Y. Tanaka, M. Fukutorni and T. Asano, Jpn. J. Appl. Phys. 27 209 (1988)). These breakthroughs have indicated a promising future for superconductivity. With these HTS materials, it is possible to have applications at 77 K. Using liquid nitrogen as a coolant, the cryogenic systems can be greatly simplified making superconductivity application more realistic and economic. It has been found that not only the Tc's of HTS are much higher, the upper critical field, Bc2, has been measured to reach a value on the order of 100 T (U. Welp, W. Kwok, G. W. Crabtree, K. Vandervoort, and J. Z. Liu, Phys. Rev. Lett., 62 1908 (1989)), making them ideal candidates for high-field applications. However, it has also been found that HTS materials carry extremely low critical current densities in the unoriented polycrystalline form as a result of their crystal anisotropy and grain boundary weak links (R. J. Cava, et al., Phys. Rev. Lett. 58, 1676 (1987)). The research effort has been focused on enhancing Jc by texturing grains and identifying coupling mechanisms at interfaces (S. E. Babcock, X. Y. Cai, D. L. Kaiser, and D. C. Larbalestier, Nature 347, 167 (1990)). These efforts have resulted in significant improvement in critical current density, particularly in $YBa_2Cu_3Ox$ (123) (J. W. Ekin, Adv. Cer. Mater. 2, 586 (1987); D. Shi et al., Appl. Phys. Lett., 57 2606, (1990); K. Salama and D. F. Lee, Supercon. Sci. Technol. 7, 177 (1994)) and Bi—Sr—Ca—Cu—O (BSCCO) systems (Q. Li, H. A. Hjuler and T. Freltoft, Physica C, 217 360 (1993); U. Balachandran, A. Iyer, P. Haldar, J. Hoehn, L. Motowidlo, G. Galinsid, Appl. Supercon. 2 251 (1994); H. Santhage, G. N. Riley Jr., and W. L. Carter, J. Metals, 43 21 (1991); R D. Ray II and E. E. Hellstrom, Physica C, 172 227 (1993)). For the 123 compound, Jc has reached the order of 104 A/cm2 at 5 T (P. G. McGinn et al. Appl. Phys. Lett. 57 1455 (990); R. L. Meng, C. Kinalidis and Y. Y. Sun, Nature 345 326 (1990); D. Shi, S. Sengupta, J. Luo, C. Varanasi, and P. J. McGinn, Physica C, 213 179 (1993)) indicating strong pinning strength in the system. But the current density in the BSCCO system is still limited, particularly at high fields above 30 K as a result of 2D vortex nature (K. E. Gray, Appl. Supercon., 2 295 (1994)).

Introduction of defects in intermetallic type II superconductors was proposed to increase their critical current density. See, for example, Campbell et al., "Pinning of Flux Vortices in Type II Superconductors," Phil. Mag., 18, 313 (1968).

However, in the case of high-temperature superconductors, the introduction of defects to increase critical current density to a useful level has met with only limited success. For example, in Gammel et al., Phys. Rev. Lett., 59, 2592 (1987), an increased density of twin boundaries provides only moderate improvement in flux pinning. Some increase in low temperature Jc in $YBa_2Cu_3O_7$ in strong magnetic fields was achieved by the introduction of point defects by neutron irradiation in, for example, Willis et al., "Radiation Damage in $YBa_2Cu_3O_{7-x}$ By Fast Neutrons", High Temperature Superintroductors, MRS Symposium Proceedings Vol. 99, 391–94 (1988). However, even in Willis et al., the increase in Jc was limited and at 70 K and B=4 T, increased to only about $10^4 A/cm^2$ after about 1018n $cm^{-2}$ above which value superconductivity was adversely effected by the neutron dose. This may limit the wide application of neutron irradiation to provide improvement in flux pinning. Critical currents in polycrystalline high-temperature superconductors are still further reduced by weak links at the grain boundaries, which are made worse by high porosity, misalignment of the crystalline axis of adjacent grains, and by formation and accumulation of non-superconductor phases (compounds) at boundaries between superconducting grains.

The need for additional high temperature superconductors and methods of manufacturing superconductors is great, not only to achieve superconductors with higher Tc 's, but also to achieve superconductors with improved Jc's in magnetic fields, improved mechanical properties, stability, and ease of processing.

Previous findings show that the high-current applications of BSCCO are limited to low temperatures (<30 K) since its Jc is rapidly reduced at 77K, particularly at appreciable applied fields. According to the previous experimental measurements, the Jc of $Bi_2Sr_2Ca_2Cu_3O_x$ (Bi2223) tape is on the order of 104 A/cm$^2$ at 77 K and self filed, but it is rapidly dropped to less than 1000 A/cm$^2$ below 0.5 T for the field perpendicular to the surface of the tape. At 20 K for the same configuration, however, the decrease of Jc is within 10%, showing significant pinning strength. To increase the Jc in the higher temperature range, extensive effort has been devoted to the enhancement of flux pinning by manipulation of micro structure (D. Shi, M. Blank, M. Patel, D. Hinks, K. Vandervoort, and H. Claus Physica C 156, 822 (1988); K. C. Goretta, B. P. Brandel, M. T. Lanagan, J. G. Hu, D. J. Miller, S. Sengupta, J. C. Parker, M. N. Ali, and Nan Chen, IEEE Transactions on Apply. Superconductivity, 5, 1309 (1995)) and radiation damage (H. Safar et el., Appl. Phys. Lett. 67 130 (1995)). The former has been successful only at low temperatures and the latter is considered not practical for industrial applications. It is, therefore, important to develop new methods by which flux pinning can be sufficiently increased in the BSCCO system.

Various methods of increasing the Jc of superconductors are known in the art. These methods are generally though some type of "pinning" of flux lines through the introduction of defects into the superconductor material as described in the following patents.

U.S. Pat. No. 5,430,008, Morris, issued Jul. 4, 1995, discloses superconducting materials and methods of forming superconducting materials. Highly oxidized superconductors are heated at a relatively high temperature so as to release oxygen, which migrates out of the material, and form a non-superconducting phase which does not diffuse out of grains of the material. The material is then re-oxidized at a lower temperature, leaving the non-superconducting inclusions inside a superconducting phase. The non-superconducting inclusions act as pinning centers in the superconductor, increasing the critical current thereof.

U.S. Pat. No. 5,399,547, Negm et al., issued Mar. 21, 1995, provides a method for increasing the critical current density carried by high transition temperature superconductive materials. The methodology is employed using any Noble metal to form an electrically conductive coating, and is used with any high transition temperature superconductive material conventionally known.

U.S. Pat. No. 5,340,794, Tallon et al., issued Aug. 23, 1994, discloses a process of heat treatment to produce a high Tc superconductor with increased flux pinning. A precursor compound is subjected to temperature and oxygen pressure conditions at which the precursor compound decomposes or converts partially or completely to the high Tc superconductor and precipitated non-superconducting compounds which are dispersed through the structure of the high Tc superconductor and which are effective to pin lines of magnetic flux. The precursor compound may or may not itself be a high Tc superconductor. In the YBCO system, 2-4-7 may be converted to 1-2-3 or 1-2-3 to 2-4-7 and flux pinning copper oxides dispersed through the structure, for example, various other transformations are possible.

U.S. Pat. No. 5,308,800, Wehrle et al., issued May 3, 1994, discloses an apparatus and method for fabricating textured pseudo-single crystal bulk superconducting materials, featuring introduction of a pressure gradient and/ or of a magnetic field for enhancement of known melt-texturing directional solidification techniques using a steep temperature gradient furnace for increasing temperatures at which superconductive properties can be maintained in superconducting materials. The strengths of the temperature gradient, pressure gradient and/or magnetic field can be optimally varied, resulting in formation of superconducting material exhibiting superconductive properties at higher temperatures than previously achievable.

U.S. Pat. No. 3,615,881, Greene, issued Oct. 26, 1971, relates in general to superconductive materials, and more particularly to vacuum-deposited superconductive films having improved characteristics. Type H superconductive material is bombarded with high velocity, heavy ions-which penetrate deeply into the material, causing disorientation in the lattice structure of sufficient magnitude to serve as flux pinning sites when the material is operated as a current carrier in a cryogenic environment below its critical temperature, and at field strengths between Hc1 and Hc2.

The present invention is targeted at the Jc enhancement in BSCCO at 77 K and respectable fields. A novel approach to the effective pinning of 2D vortices is provided. With this approach, Jc(H) can be significantly increased in BSCCO (both Bi2212 and Bi2223) at much higher temperatures (>40 K).

SUMMARY OF THE INVENTION

Figure 1:
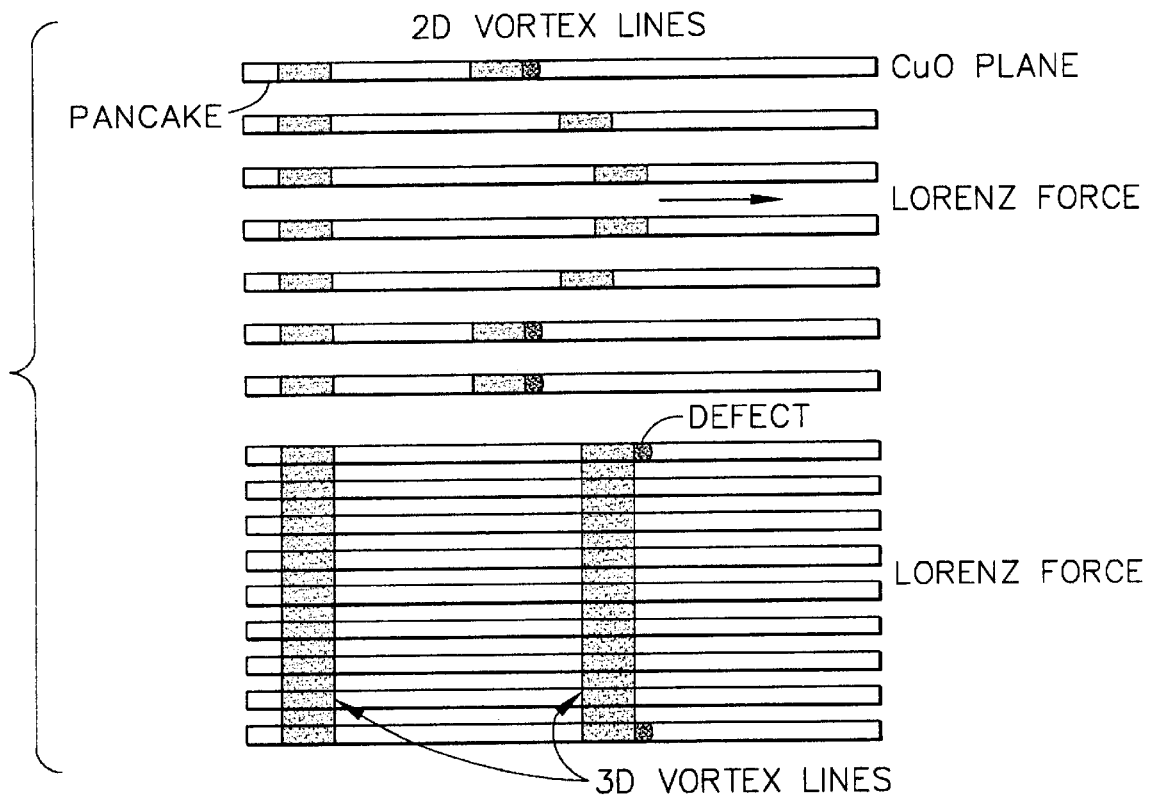
FIG. 1. Schematic diagram showing the pinning characteristics of 2D and 3D vortices.

Improved superconductors and methods of manufacturing superconductors are disclosed. In one embodiment the invention provides a method of producing pinning centers in the superconductor material and in some embodiments controlling and optimizing the size, shape, and distribution of pinning centers within superconductors.

Additionally, high-temperature superconductors, made by the methods of the present invention, are disclosed.

DETAILED DESCRIPTION OF THE INVENTION

Pinning of 2D Vortices by Needle-Like Nanophases in Oxide Superconductors

In the present invention, microstructures are developed that will enable a strong pinning of the 2D vortices. Principally, for enhancement of core pinning energy ("Ep"), needle-like nanophases are developed and introduced into the matrices of superconductor materials in a textured fashion. In this way, the 2D vortices are pinned effectively. The defect structure constructed is similar to that of irradiation damaged materials, but much more viable in industrial applications. The presented methods are a most promising and ultimately effective way of increasing current carrying capacity in oxide superconductor compounds.

In one embodiment, the invention comprises a method for producing a high temperature superconductor, the method comprises the steps of (a) creating thin green sheets of superconducting material and oriented, needle-like nanophase mixture, (b) slicing said thin green sheets perpendicular to the surface of the thin green sheet;

(d) placing the thin green sheet slices onto a metal substrate with the needle-like nanophases oriented normal (perpendicular) to the large surface of the metal substrate; and (e) heating the thin green sheet slices to partially melt the slices onto the substrate; the high temperature oxide superconductor produced having a higher critical current than the high temperature superconductor without the oriented needle-like nanophase.

In another embodiment, the method comprises the steps of (a) creating thin green sheets of superconductor and oriented, needle-like nanophase mixture (b) laminating a plurality of said thin green sheets (c) slicing said laminate of thin green sheets perpendicular to the surface of the thin sheet laminate (d) placing the thin sheet laminate slices onto a substrate with the needle-like nanophases oriented normal to the large surface of the sheet (e) heating the thin sheet laminate slices to partially melt the laminate onto the substrate as well as to burn out organics and to form proper phase species; the high temperature oxide superconductor having a higher critical current than the high temperature superconductor without the oriented needle-like nanophase.

In another embodiment, the present invention includes methods for producing a high temperature oxide superconductors, the high temperature superconductors comprising materials selected from the group consisting of Re—Ba—Cu—O, Y—Ba—Cu—O, Bi—Sr—Ca—Cu—O, Ba—K—Bi—O, Tl—Ba—Ca—Cu—O, La—Sr—Cu—O and combinations thereof, and the high temperature superconductors are formed by mixing a superconductor starting material powder with non-superconducting needle-like nanophases.

Optionally, creating the thin green sheet in a magnetic field such that the magnetic flux created is substantially perpendicular to the thin green sheet. The magnetic field strength must be that strength necessary for orienting the needle-like nanophase in a substantially perpendicular manner.

As used herein, the term high temperature superconductor ("HTS") refers to oxides which contain (1) copper and/or bismuth, (2) barium or other alkaline earths such as strontium or calcium, and (3) trivalent elements such as yttrium Rare earth elements having atomic numbers ranging from 57 to 71 (lanthanum ("La"), cerium ("Ce"), praseodymium ("Pr"), neodymium ("Nd"), promethium ("Pm"), samarium ("Sm"), europium ("Eu"), gadolinium ("Gd"), terbium ("Tb"), dysprosium ("Dy"), holmium ("Ho"), erbium ("Er"), thulium ("em"), ytterbium ("Yb"), and lutetium ("tu")), are substituted for yttrium ("Y") in some materials, as are thallium ("Tl") or bismuth ("Bi"). Representative of superconductors are the following:

(1) oxide materials containing lanthanum, strontium and copper, bearing the formula $La_{2-x} Sr_x CuO_4$, commonly referred to as "La—Sr—Cu—O" or "L—S—C—O", and recently discovered variants thereof such as materials in which La substituted with, for example, praseodymium, neodymium, uranium, thorium, cerium and others containing a tetravalent ion in place of Sr;

(2) oxide materials containing yttrium, barium and copper, bearing the formula $YBa_2Cu_3O_7$, commonly referred to as 1-2-3 (rare earth elements can be substituted for yttrium, and the resulting compounds are also superconducting). Other "Y—Ba—Cu—O" or "Y—B—C—O" materials include 1-2-4 and 2-4-7;

(3) oxide materials containing bismuth, strontium, calcium and copper, bearing such formulas as $Bi_2CaSr_2Cu_2O_{8+x}$ and $Bi_2Ca_2Sr_2Cu_3O10+x$, commonly referred to as "Bi—Sr—Ca—Cu—O" or "B—S—C—C—O," and related materials including those in which Pb and copper replace Bi;

(4) oxide materials containing thallium, barium, calcium and copper, bearing such formulas as $Tl_2Ba_2CuO_x$, $Tl_2CaBa_2Cu_2O_x$, $Tl_2Ca_2Ba_2Cu_2O_x$, $Tl_2Ca_2Ba_2Cu_4O_x$, $TlCaBa_2Cu_2O_x$, and $TlCa_2Ba_2Cu_3O_x$, commonly referred to as "Tl—Ba—Ca—Cu—O" or "T—C—B—C—O", and related materials including those in which Pb and/or Cu replace Tl; and (5) oxide materials containing bismuth, barium, potassium and copper, bearing the formula $Ba_{1-x} K_x BiO_3$, identified as "Ba—K—Bi—O" or "B—K—B—O".

By way of example, the invention is illustrated herein with regard to the formation of bismuth-strontium-calcium-copper oxide ("BSCCO" or "Bi—Sr—Ca—Cu—O") superconductors, but the invention is not so limited. Examples of other materials suitable to such a process include but are by no means limited to the Y—Ba—Cu—O materials, the Tl—Ca—Ba—Cu—O materials, the Bi—Sr—Ca—Cu—O materials, the La—Sr—Cu—O materials, the Ba—K—Bi—O materials, and other high Tc oxide superconductors.

One important aspect of the invention is that a composition is used to form a superconducting phase interspersed by oriented nanophases which act as flux pinning centers and which da not migrate significantly. Therefore, the invention will find use not only in the above-mentioned materials, but also in many materials of which exemplary materials are discussed in detail herein.

In some embodiments the invention provides magnetic flux pinning centers having controllable or predictable size and shape within the grains of the crystals. By varying the size of the pinning centers, the pinning strength of the material may readily be adjusted. In preferred embodiments, the size of the pinning center is adjusted to be about the coherence size, and in some embodiments between 1 and 1000 Angstrom, in preferred embodiments between 10 and 100 Angstrom in the plane of the material, and in BSCCO, for example, the pinning centers have dimensions of about 20 Angstrom in the plane of the superconducting material and about 2 Angstrom perpendicular to the plane.

Flux pinning centers have improved orientations according to the invention herein. One embodiment of the invention herein provides pinning centers of a desired orientation such that the fluxoids or vortices may be pinned in line nanophases that lie substantially along lines or planes, rather than points. A fluxoid being a flux line, a magnetic field which penetrates the HTS and forms vortices. The flux lines, or fluxoids, have magnetic fields highest in the centers and decrease outwardly. The flux lines are not random but form a lattice in the HTS material. Inside the flux line, the material is not superconductive but form normal cores. The material may then be optimally used in an orientation wherein such planes or lines of defects lie in the planes of or parallel to direction of the fluxoid. These planes or lines in some embodiments lie along the a-b plane of the superconductor while in other embodiments they lie along the C axis. Current is, similarly, passed along the plane of the nanophases. In Cu-based superconductors, this plane will generally lie in the plane of $CuO_2$ sheets. It is preferred that while the current and magnetic flux lines lie in the same or parallel planes, that they be substantially perpendicular to each other since the magnetic field produced by a current is perpendicular to the current and the objective is to transmit strong or concentrated currents or strong magnetic fields.

A. Starting Materials (1) Oxide Superconductor Materials

By way of example, the invention is illustrated herein with regard to the formation of superconducting yttrium-barium-copper oxide superconductors, but the invention is not so limited. Examples of other materials suitable to such a process are materials which have multiple phases whose stability depends upon oxygen content. Such materials include but are by no means limited to the Y—Ba—Cu—O materials, the Tl—Ca—Ba—Cu—O materials, the Bi—Ca—Sr—Cu—O materials, the La—Sr—Cu—O materials, the Ba—K—Bi—O materials, and other high Tc oxide superconductors.

The present invention is, by way of example, applicable to superconductor materials which contain or are fabricated from metals or metal oxides. Preferred metals have several valence states. Among these, copper and bismuth are particularly preferred.

These metals or metal oxides may be combined with other metals or metal oxides. Included among the latter are divalent metals such as, for example, barium, strontium, calcium and cadmium; trivalent metals such as, for example, yttrium, scandium, bismuth, thallium; transition metals; the rare earth elements (lanthanum through lutecium); and metals in general which are highly electro-positive, or have large electric polarizabilities. Preferred among the rare earth elements are neodymium, samarium, europium, gadolinium, dysprosium, holmium, erbium and thulium.

In addition to the elemental metals and the metal oxides, the metals used in the preparation of the superconductors of the present invention may be in the form of nitrates, carbonates, oxalates, tartrates, and any other form which yields the oxide upon heating in oxygen. The metals used in the process may also be in the form of mixed oxides or compounds, that is to say, compounds each of which incorporate more than one of the metals.

In preferred embodiments, metal oxides are used in a chemical and physical form which will render them highly reactive at elevated temperatures. Examples include the use of finely divided particles to provide large surface energies, and chemical forms such as peroxides or mixed oxides which have lower chemical binding energy than either the desired product or other compounds which can be formed from the metals or metal oxides. In the case of barium, the preferred form is BaO. In the case of copper, the preferred form is CuO. In the case of yttrium, the preferred form is $Y_2O_3$.

The metals or metal compounds may be combined in relative amounts such that the atomic ratio of the metals is approximately the same as that of the superconductor to be formed. For example, when the desired compound is $YBa_2Cu_4O_8$, the yttrium, barium and copper metals are combined in the atomic ratios of about 1:2:4.

The supply of oxygen at a high oxidizing potential in the practice of the present invention may be achieved in a variety of ways. Molecular oxygen at hyperbaric pressure, or preferably appropriate combinations of temperature and pressure may be used. Ozone and atomic oxygen may be used in the alternative.

Further means of supplying oxygen at high oxidizing potential are the use of oxygen incorporated in a highly oxidized chemical compound which under appropriate conditions will release the oxygen, thus making it available for the formation of a second highly oxidized compound which is a superconductor. Such oxygen-supplying compounds include, but are not limited to, peroxides or nitrates of the constituent metals, as well as other highly oxidized compounds which may themselves be superconductors. To form the desired product, these oxygen-supplying compounds are placed in contact, and preferably mixed intimately, with the other constituent materials.

Still further means of supplying oxygen at high oxidizing potential are those involving the use of electrical current. Such means may for example involve placing the constituent starting materials in an electro-chemical cell containing an electrolyte which releases oxygen when exposed to an electric current. One example of such an electrolyte is $ZrO_2$. This method and that of the preceding paragraph may reduce or eliminate the need for elevated temperature during synthesis of the superconductor.

In preferred embodiments of the invention, the high oxidizing potential oxygen supply is molecular oxygen, ozone, or atomic oxygen, either alone or combined with each other or with inert gases. Molecular oxygen is preferred. When molecular oxygen is used, the gas mixture is preferably at least about 50% molecular oxygen, more preferably at least about 90% oxygen, and most preferably substantially 100% molecular oxygen. With molecular oxygen, the pressure is higher than the boundary region of 1-2-4 at a given temperature. Pressures less than 200 bar may readily be used through the use of temperatures below about 1050° C.

The temperature and heating time may vary, depending on the materials used. Higher temperatures will generally require less heating time. In preferred embodiments, the heating is done at a temperature of at least about 700° C. for at least 10 hours, or at least about 800° C. to about 850° C. for about 1 hour. If the material is finely divided, lower temperatures (e.g., 600° C. to 700° C.) may be used.

Since superconducting phases of a highly oxidized state are formed herein, many new materials having superconducting capabilities, particularly with high superconducting transition temperatures, may be formed. It is thus expected 1 that many new superconductors will be discovered by virtue of and through the practice of the methods disclosed herein.

Also by virtue of the methods disclosed herein, 1-2-4 materials can be reacted and/or sintered at significantly higher temperatures than 1-2-3 materials, without loss of phase identity. This is useful in the densification of the materials for enhancement of the superconducting current density Jc. Similar procedures may be applied to 1-2-3 by appropriate selection of temperature and pressure to suppress decomposition of 1-2-3.

The high temperature superconductor comprises a material selected from the group of Re—Ba—Cu—O, Y—Ba—Cu—O, Bi—Sr—Ca—Cu—O, Ba—K—Bi—O, Tl—Ba—Ca—Cu—O, and combinations thereof Preferably, a starting material from the group of oxide superconductors consisting of $R_1Ba_2Ca_3O_x$, $RlBa_2Cu4O_x$, $Bi_2Sr_2Ca_2Cu_3O_x$, and $Tl_2Ba_2CaCu_3O_x$, wherein R is selected from the group consisting of yttrium and rare earth metals.

The invention may be carried out with RBCO system compounds when R is or consists essentially of Y or any of the lanthanide rare earth elements La, Nd, Sm, Eu, Gd, Dy, Ho, Er, Tm or Yb or any thereof partially substituted by any of Na, K, Cs, Rb and Ca; and B is or consists essentially of Ba or Ba partially substituted by any of La, Nd, Ca, Sr, Pb, Na and K or any lanthanide rare earth element.

In the form of the invention as applied to the BCSCO (Bi/Ca/Sr/Cu/O) and Thallium systems, the invention comprises heating a bismuth or thallium superconducting cuprate to a temperature and oxygen partial pressure at which the cuprate will partially decompose to a lower homologue. By these systems is meant those superconductors in the form a homologous series of compounds of nominal composition:

$$M_m R_n A_2 Cu_a O_{4+2n \cdot m}$$

where M is any of or any combination of Bi, Pb, Tl and: Sb, R is Ca or Ca partially substituted by Sr, Y, La or any of or any combination of the lanthanide rare earth elements, and A is either or both of Sr and Ba or any or both of Sr and Ba and any of the lanthanide rare earth elements. In the case of RBCO 1-2-3 and RBCO 1-2-4 it is preferred to partially substitute Ba by any of or any combination of La, Ca and the lanthanide rare earth elements and most preferably La. Preferred 1-2-3 compounds comprise $RB_{2-x} A_x Cu_3O_{7 \cdot delta}$ where $0<x \leq 0.1$ and A is any of or any combination of La, Ca and the lanthanide rare earth elements and most preferably La, and R is Y, La, Ce, Pr, Nd, Sm, Eu, Gd, Dy, Ho, Er, Tm, Yb, Na, K, Cs, Rb or Ca or any combination thereof, and B is Ba or Ba and any one or more of Ca, Sr, La, Li, Na, K, Rb and Cs in combination.

It will be recognized and appreciated that refractory ceramic oxides which constitute high transition temperature superconductors are desirable as the starting materials when using the present invention. The utilization and deployment of high transition temperature superconductors in current applications will depend in major degree upon the electrical properties of the individual superconductive material.

(a) BSCCO Materials

In one preferred embodiment, the starting material is the bismuth-strontium-calcium-copper-oxide superconductor. The 2122 phase $Bi_2Sr_1Ca_2Cu_2O_x$ and the 2223 phase $Bi_2Sr_2Ca_2Cu_3O_x$ are each stable at different P(O2) at the same temperature (e.g., see Endo et al., "Preparation of High Tc Phase of Bi—Sr—Ca—Cu—O Superconductor," Jap. Journal of App. Phys., August 1988, pp. 1446, which is incorporated herein by reference). Thus interconversion of 2223→2122+$CaCuO_2$ and/or other non-superconducting phases is possible by heating 2223 in an increased $P(O_2)$ of approximately equal $10^{-3}$ atmospheres ("ATM") or above following a procedure similar to that set forth above.

In another preferred embodiment a high $P(O_2)$ is applied to a BSCCO 2-1-2-2 superconductor of the general formula $Bi_2Ca_1Sr_2Cu_2O_x$. This composition has been shown to be unstable at high $P(O_2)$ at, for example, 600°–800° C. (see, for example, Morris et al., "Oxygen Concentration Effect on Tc of the Bi—Ca—Sr—CuO Superconductor," Phys. Rev. B., Vol. 39, No. 10, pp. 6612 (1989), which is incorporated herein by reference) as shown by a decreasing low temperature Meissner diamagnetism with increasing treatment time or temperature, but with an unchanging diamagnetism onset temperature. Therefore, heating BSCCO superconductor in high $P(O_2)$ will cause precipitation of non-superconducting phases in a manner similar to 1-2-3 heated in low $P(O_2)$. A subsequent anneal at a lower temperature will optimize the superconducting properties and Tc while avoiding diffusion of the non-superconducting precipitate which could make pinning centers unduly large.

In an alternative embodiment, a high $P(O_2)$ is applied at elevated temperature to the $Ba_{1-x} K_x BiO_3$ (BKBO) superconductor. This causes oxidation of Bi to $Bi^{+5}$ and thereby de-stabilizes the superconductor. The rest of the procedure follows the above embodiment. In the case of BKBO an added advantage is that evaporation of K is suppressed by the high $P(O_2)$.

In another alternative embodiment, the above process is applied to $Bi_2Sr_2Ca_2Cu_3O_x$ (2223), $Bi_2Sr_2Ca_3Cu_4O_x$ (2234), and $Bi_2Sr_2Ca_4Cu_5O_x$ (2245) oxide superconductors.

In yet another embodiment, the above process is applicable to thallium-containing superconductors such as $TlBa_2Ca_2Cu_3O_x$ (Tl12223) and $Tl_2Ba_2Ca_2Cu_3O_x$ (Tl2223). Application of high $P(O_2)$ prevents the reaction:

$$Tl_2(III)O_2 \rightarrow Tl_2(I)O+O_2$$

so as to prevent evaporation and consequent loss of Tl and permits controlling the synthesis of Tl superconductor with more uniform structure since the Tl concentration does not vary. Also, the resulting fully oxidized Tl will give an optimal Tc.

(b) Cuprate High Tc Superconductor Starting Materials (i) 1-2-4 Starting Material In one preferred embodiment, the invention utilizes the $YBa_2Cu_4O_8$ (1-2-4) phase or one of its rare earth analogues as a starting material. The 1-2-4 phase is heated in low pressure oxygen such that it decomposes at least in part into a 1-2-3 tetragonal (non-superconducting) phase plus one or more non-superconducting copper rich phase(s) such as CuO and/or $BaCuO_2$ and/or $Y_2BaCuO_5$ and/or $Cu_2O$. This treatment of the 1-2-4 phase is carried out at a temperature such that oxygen from the reaction diffuses out of the grains of superconductor but, in this embodiment, the temperature and pressure are adjusted to prevent decomposition of 1-2-3. This will leave a multiphase system with small Cu-rich phase regions within the 1-2-3 crystallites and any remaining 1-2-4 crystallites if present. The temperature and $P(O_2)$ is, in preferred embodiments, chosen such that x is between about 6.1 and 6.6 in $Y_1Ba_2Cu_3O_x$ under equilibrium conditions. The step of heating in low pressure oxygen is optionally followed by the step of heating at somewhat higher temperatures such that the Cu diffuses small.distances and increases the size scale of the pinning centers for further optimized flux pinning.

The 1-2-3 material is then treated with oxygen at lower temperatures and re-oxidized to the orthorhombic superconducting phase, leaving the Cu-rich non-superconducting inclusions trapped inside the 1-2-3 material, plus any remaining 1-2-4 phase. Superconducting materials prepared according to the invention will be particularly useful in conditions under which thermally activated flux creep is important. For example, the materials will find use in high temperature conditions in strong magnetic fields.

(ii) 1-2-3 Starting Material

In another preferred embodiment, the starting material is the 123 material $YBa_2Ca_3O_x$ or its rare earth substituted analogues. The 123 phase is heated in a low partial pressure oxygen $P(O_2)$) or in a partial vacuum. The $P(O_2)$ is chosen low enough e.g., between about $10^{-1}$ bar to $10^6$ bar or less (about 1 ppm $O_2$ or less) at temperatures about 500° to 600° C. so that x is less than about 6.2 to 6.0 in $YBa_2Cu_3O_x$ under equilibrium conditions. The required pressure will depend on temperature. Under these conditions the 123 compound is unstabilized and begins to separate locally into non-superconductors such as $Y_2Ba_1Cu_1O_5$, $BaCuO_2$, $CuO_1$, $Cu_2O$, etc. In this embodiment the decomposition is preferably halted before the decomposition is complete. The temperatures and pressures selected for decomposition of 1-2-3 will vary over a wide range of values in addition to the above-cited values. Temperatures and pressures for decomposition may be selected for 1-2-3 based upon the stability information presented in Borman et al., Appl. Phys. Lett., 54 (1989), which is incorporated herein by reference. The sample is cooled and then re-oxygenated at a higher $P(O_2)$ (e.g., $P(O_2)$ of approximately equal 1 bar). The re-oxidation could, alternatively, be done before cooling.

(c) Synthesis of Oxide Superconductor Starting Materials

The present invention is, by way of example, applicable to superconductor materials which contain or are fabricated from metals or metal oxides. Preferred metals have several valence states. Among these, copper and bismuth are particularly preferred.

These metals or metal oxides may be combined with other metals or metal oxides. Included among the latter are divalent metals such as, for example, barium, strontium, calcium and cadmium; trivalent metals such as, for example, yttrium, scandium, bismuth, thallium; transition metals; the rare earth elements (lanthanum through lutetium); and metals in general which are highly electro-positive, or have large electric polarizabilities. Preferred among the rare earth elements are neodymium, samarium, europium, gadolinium, dysprosium, holmium, erbium and thulium.

In addition to the elemental metals and the metal oxides, the metals used in the preparation of the superconductors of the present invention may be in the form of nitrates, carbonates, oxalates, tartrates, and any other form which yields the oxide upon heating in oxygen. The metals used in the process may also be in the form of mixed oxides or compounds, that is to say, compounds each of which incorporate more than one of the metals.

In preferred embodiments, metal oxides are used in a chemical and physical form which will render them highly reactive at elevated temperatures. Examples include the use of finely divided particles to provide large surface energies, and chemical forms such as peroxides or mixed oxides which have lower chemical binding energy than either the desired product or other compounds which can be formed from the metals or metal oxides. In the case of barium, the preferred form is BaO. In the case of copper, the preferred form is CuO. In the case of yttrium, the preferred form is $Y_2O_3$.

The metals or metal compounds may be combined in relative amounts such that the atomic ratio of the metals is approximately the same as that of the superconductor to be formed. For example, when the desired compound is $YBa_2Cu_4O_8$, the yttrium, barium and copper metals are combined in the atomic ratios of about 1:2:4.

For synthesizing BSCCO, one typically mixes together $Bi_2O_3$, $SrCO_3$, $CaCO_3$, and CuO in the desired stochiometry. The carbonates of Sr and Ca are used because the oxides (SrO and CaO) are difficult to handle as they pick up water or $CO_2$ from the atmosphere and become hydroxides or carbonates. These powders, which must have a small particle size (1–5 $\mu$m) to achieve fast reaction kinetics, are thoroughly mixed, then calcined at elevated temperature to remove the $CO_2$ and begin the solid-state reaction. Normally the powders are heated in air. During heating it is important to prevent local melting in the powder resulting from local variations in composition. To prevent this, one carries out the reaction in stages, beginning at low temperature (750° C.). After several hours of heating, the powder is cooled, ground using a mortar and pestle, and re-fired at a higher temperature. This process is repeated several times, with the maximum temperature being limited to about 850° C. At this point the powder is mainly the 2212 phase. The synthesis can be done with loose powder, which gives a slower reaction but makes it easier to grind the powder between heating cycles, or with compacted powder, which accelerates the reaction kinetics but requires more grinding between heating steps that can introduce more impurities into the powder.

It is important to remove the $CO_2$ from the powder during the solid state synthesis. Practical experience shows that the C content in the powder used for conductors should be about 0.04 wt. % or lower. To remove the $CO_2$ during synthesis, one must have a furnace arrangement that allows the $CO_2$ to escape, such as a tube furnace with open ends or through which gas, typically air or $O_2$, can be flowed. In contrast, a typical box furnace is rather well enclosed, impeding the loss of $CO_2$. Solid-state synthesis of 2212 in a typical box furnace can take much longer than in a tube furnace, unless gas is flowed into the box furnace to sweep out the evolving $CO_2$. One must be aware that Bi (and Pb for 2223) can vaporize from the powder at elevated temperature, thereby changing the overall composition (Note that Pb loss is much greater than Bi loss).

Some methods have used low-pressure synthesis to increase the rate of solid-state reactions using carbonates. They synthesize the powder in a reduced-pressure reactor with flowing $O_2$ (Ptot=p$O_2$=3 torr for the BSCCO system). The advantages with this synthesis are that $CO_2$ can be removed from the carbonates at lower temperatures than in air (which contains 0.033 vol. % $CO_2$), the gas flow sweeps the $CO_2$ from the reaction chamber, allowing the reaction to continue, and the low pressure pulls the evolving $CO_2$ gas out of the interior of the mass of powder where it forms.

As another alternative specifically involving formation of the 1-2-4 compound, a substrate including the 1-2-3 compound or another compound containing one or more of the constituent metals of the 1-2-4 compound may be heated in concentrated or high pressure oxygen and thereby converted to the 1-2-4 compound.

The supply of oxygen at a high oxidizing potential in the practice of the present invention may be achieved in a variety of ways. Molecular oxygen at hyperbaric pressure, or preferably appropriate combinations of temperature and pressure may be used. Ozone and atomic oxygen may be used in the alternative.

Further means of supplying oxygen at high oxidizing potential are the use of oxygen incorporated in a highly oxidized chemical compound which under appropriate conditions will release the oxygen, thus making it available for the formation of a second highly oxidized compound which is a superconductor. Such oxygen-supplying compounds include, but are not limited to, peroxides or nitrates of the constituent metals, as well as other highly oxidized compounds which may themselves be superconductors. To form the desired product, these oxygen-supplying compounds are placed in contact, and preferably mixed intimately, with the other constituent materials.

Still further means of supplying oxygen at high oxidizing potential are those involving the use of electrical current. Such means may for example involve placing the constituent starting materials in an electro-chemical cell containing an electrolyte which releases oxygen when exposed to an electric current. One example of such an electrolyte is $ZrO_2$. This method and that of the preceding paragraph may reduce or eliminate the need for elevated temperature during synthesis of the superconductor.

In preferred embodiments of the invention, the high oxidizing potential oxygen supply is molecular oxygen, ozone, or atomic oxygen, either alone or combined with each other or with inert gases. Molecular oxygen is preferred. When molecular oxygen is used, the gas mixture is preferably at least about 50% molecular oxygen, more preferably at least about 90% oxygen, and most preferably substantially 100% molecular oxygen. With molecular oxygen, the pressure is higher than the boundary region of 1-2-4 at a given temperature. Pressures less than 200 bar may readily be used through the use of temperatures below about 1050° C.

The temperature and heating time may vary, depending on the materials used. Higher temperatures will generally require less heating time. In preferred embodiments, the heating is done at a temperature of at least about 700° C. for at least 10 hours, or at least about 800° to about 850° C. for about 1 hour. If the material is finely divided, lower temperatures (e.g., about 600° to about 700° C.) may be used.

Since superconducting phases of a highly oxidized state are formed herein, many new materials having superconducting capabilities, particularly with high superconducting transition temperatures, may be formed. It is thus expected that many new superconductors will be discovered by virtue of and through the practice of the methods disclosed herein.

Also by virtue of the methods disclosed herein, 1-2-4 materials can be reacted and/or sintered at significantly higher temperatures than 1-2-3 materials, without loss of phase identity. This is useful in the densification of the materials for enhancement of the superconducting current density Jc. Similar procedures may be applied to 1-2-3 by appropriate selection of temperature and pressure to suppress decomposition of 1-2-3. A preferred method of densification is hot isostatic pressing ("HIP"), a procedure known in the art. Upon applying the HIP technique to single-phase 1-2-4 materials, any initial conversion of the 1-2-4 to the 1-2-3 phase will terminate at an early stage once the internal oxygen pressure reaches about 5 to about 30 bar at temperatures of about 950° to about 850° C.

(2) Needle-Like Nanophases

The next task is to fabricate needle-like nanophases ("NLN") that will not react with the oxide superconductor materials. Needle-like nanophases are well known in the art and are available commercially or through a variety of well know synthesis techniques.

As used herein, the term nanophase refers to materials used for flux pinners having unique properties such as high strength, flexibility, and formability. Preferably the material is inert to the superconductor to which the nanophase is added. Examples include Ag, CeO, MgO, $Al_2O_3$, $ZrO_2$, $TiO_2$, $SrTiO_3$, $LaAlO_3$, AgO, TiO, $Y_2BaCuO_5$, $BaCuO_2$, CuO, and $Cu_2O$. Some nanophases are commercially available from Argonne National Laboratory, Argonne, Ill., and Chemat Co., Northridge, Calif. Needle-like nanophases ("NLN") are nanophases fashioned into needle or rod-like shapes which have an aspect ratio (length/width ratio) of from about 2 to about 50 and is preferably about 10. In general, the NLN are from about 50 to about 1000 nm in length and from about 1 to about 30 nm in diameter. Preferably, the NLN are from about 200 to about 500 nm in length and from about 5 to about 10 nm in diameter.

One method available is the hydrothermal treatment of acidified aqueous alkoxide solutions based on various high purity magnesium alkoxide precursors (U.S. Pat. No. 2,915,475, J. Bugosh, (1959); incorporated herein in its entirety by-reference). The process can be easily scaled up for mass production. Methods for the synthesis of other needle-like nanophases including pure silver and TiO are available.

Fairly monodisperse colloidal boehmite (AlOOH) fibrils with a high aspect ratio may also be synthesized by hydrothermal treatment at 150° C. of an acidified aqueous alkoxide solution, prepared by adding an aqueous-HCl solution to an aluminum alkoxide precursor. The average particle length can be controlled between about 100 and about 500 nm by varying the initial amounts of alkoxide and acid. Using two different alkoxides in a 1:1 molar ratio yields the most needle-like product, having a particle length standard deviation of about 40%. The boehmnite particles are polycrystalline and contain about 0.14 mole of excess $H_2O$ per mol of AlOOH, bound to the particle surface.

The hydrothermal treatment of acidified aqueous alkoxide solutions is based on various high purity aluminum alkoxide precursors. The solutions can be easily prepared on a liter scale, while a wide range of both $Al^{3+}$ and $Cl^-$ concentrations can be reached, which allows control of the resulting boehmnite fibril length. $Al(OR)_3$ is readily hydrolyzed by water and produces different hydroxide phases according to temperature.

The alkoxides useful in the present invention are aluminum tri-sec-butoxide, aluminum tri-tert-butoxide, aluminum triisopropoxide, and aluminum triisoamyl oxide. Preparation of an acidified alkoxide solution are performed by adding an excess amount of aqueous HCl to the alkoxide. After the addition of the acid to the alkoxide, a suspension of white material is formed. The acidified alkoxide solutions are poured into liners (80% filled), which fit into stainless steel pressure vessels. The vessels are rotated in an oven at 150° C. After hydrothermal treatment the vessels are suddenly cooled in water. The alcohol produced during treatment and the acid anion is removed from the sol by dialysis in a cellophane tube against deionized water. The boehmite dispersions are clear colloidal solutions exhibiting a weak blue color due to light scattering. The sols show an increase in viscosity with increasing particle length and increasing particle concentration. Removal or alcohol and chloride by dialysis raises the pH from about 1 to about 6, and a marked increase in viscosity is observed. The average particle dimensions of boehmite produced by hydrothermal treatment (at about 150° C. for about 20 hours) of various acidified alkoxide-based solutions depends upon the type of alkoxide used, the $Al(OR)_3$ concentration, and the Al:Cl molar ratio. The length of the particles can be varied roughly between about 100 nm and about 500 nm, while the particle width shows only small changes around 20 nm. In general, for the hydrothermal treatment of alkoxides, the average fibril length increases if the concentration ("$[Cl^-]$") increases, keeping $[Al^{+3}]$ constant, and the length also increases if $[Al^{+3}]$ increases, keeping the Al:Cl molar ratio constant.

In another method for the hydrothermal treatment of acidified aqueous alkoxide solutions, the alkoxide precursor used is magnesium n-propoxide ($Mg(OC_3H_7)_2$) The precursor is dissolved in water for hydrolysis and condensation. After peptizing by adding an appropriate amount of HCl, stable colloidal solutions can be formed after a slow aging process The acidified alkoxide solutions are poured into the Teflon liners in a stainless pressure vessel. The vessel is rotated at a velocity of about 6 rpm and heated at about 150° C. for about 20 hours. The needle-shaped MgO is formed during the hydrothermal treatment. Upon removal of the alcohol produced during the treatment, the needle-like fibrils are found in the sol. These needles may then be examined under the transmission electron microscope ("TEM") by spraying the sol onto a mica plate.

Preferably, the aspect ratio (length/width ratio) of these needles is about 10. The particle dimensions, and thus the aspect ratio, can be altered by using different acidified alkoxide-based solutions. For instance, the length of the needle can be increased from about 100 nm to about 500 nm when changing the Mg/Cl molar ratio, $Mg(OR)_3$ concentration, and type of alkoxide. The interfaces may be examined by both scanning electron microscope ("SEM") and TEM to observe structural coherence and chemical bonding between the pinning sites and the matrix.

Other materials to which the invention herein may be applied will be readily apparent to those skilled in the art.

B. Creating Thin Green Sheets of Oxide Superconductor and Needle-Like Nanophases Generally, thin sheets of oxide superconductor containing NLN are made using conventional tape casting process. In the tape casting process, oxide superconductor powders are mixed with NLN by various mixing techniques and made into paper-thin, flexible sheets, called "green sheets," using a continuous process. Tape casting machines are available commercially such as those by ENSCI, Limoges, France.

In tape casting, a concentrated slurry containing deflocculated powders mixed with a relatively high concentration of binder and plasticizers is prepared. The tape is formed when the slurry flows beneath a blade, forming a film on a moving carrier substrate and is then dried. Thin sheets of ceramic may also be formed by pouring the slurry onto a flat surface and moving a blade over the surface to form the film. The dried tape is generally rubbery and flexible and has a very smooth surface. Green sheets are then separated from the substrate and cut to size.

The first step in tape casting is preparation of a suitable slurry. Nonaqueous slurries are more commonly used but aqueous tape casting may also be used. Industrally, batch formulations are used with processing additives included such as liquid/solvent, dispersant (deflocculant), binder, and plasticizers. Other additives sometimes added include wetting agents or surfactants to promote spreading, a homogenizer which contributes to a better surface quality, and an antifoaming agent to prevent foaming during mixing. The specific formulation of components depends upon the specifications of the sheet desired but the apparent viscosity should be from about $10^1$ mPa*sec to about $10^6$ mPa*sec. Preferably, the casting slurry should be shear thinning and have a viscosity above 4000 mPa*s at the shear rate of casting. The binder and plasticizer concentrations for tape casting are generally much higher (the volume of binder to volume of plasticizer ("Vb/Vp") is preferably from about 100/10 to about 100/30 and more preferably from about 100/15 to about 100/25) than for pressing, extrusion and slip casting systems.

Deflocculants useful in the present invention include triglycerides (e.g., glycerol trioleate, menhaden fish oil, and mixtures thereof), sorbitan trioleate and mixtures thereof The concentration of deflocculants is generally from about 0 Vol. % to about 10 Vol. % and is preferably from about 0 Vol. % to about 2 Vol. %.

Binders useful in the present invention include polyvinyl butyral, polymethylacrylate, polyvinyl alcohol, polyethylene, acrylics, methyl cellulose and mixtures thereof. The concentration of binders is generally from about 0 Vol. % to about 12 Vol. % and is preferably from about 1 Vol. % to about 8 Vol. %.

Plasticizers useful in the present invention include polyethylene glycol, octyl phthalate, butylbenzylphthalate, dioctyl phthalate, dibutyl phthalate, glycerine and mixtures thereof-The concentration of plasticizers is generally from about 0 Vol. % to about 12 Vol. % and is preferably from about 1 Vol. % to about 8 Vol. %.

Wetting agents useful in the present invention include cyclohexanone and mixtures thereof. The concentration of wetting agent is generally from about 0 Vol. % to about 5 Vol. % and is preferably from about 0 Vol. % to about 2 Vol. %.

Preferably the NLN are dispersed in a homogeneous mix to ensure an even distribution of NLN in the matrix. Liquid DARVAN (a dispersant) may be added to the slurry for a thorough mixing of nanophases in the materials. Different mixers are used according to the viscosity of the slurry. These include impeller, flat blade turbine, ball mill, vibrator mill, and microstratifier. The degree of mixedness will be determined by various means to assess the homogeneity of the mix and the efficiency of a mixing device.

Powder dispersion is essential to obtain a high-quality surface and to obtain uniform shrinkage without coarse grains. The anisotropic NLN particles are preferentially aligned during casting. Such oriented material is referred to "textured" material.

Optionally, the thin green sheets may be created in a magnetic field such that magnetic flux is substantially perpendicular to the tape casting machine. The magnetic field strength must be that strength necessary for orienting the needle-like nanophase in a substantially perpendicular manner. The magnetic flux, in combination with paramagnetic nanophases, aligns the paramagnetic nanophases within the oxide superconductor. Methods for magnetic alignment of nanophases in ceramic materials are well known in the art.

The field strength depends upon the size of the green film and the article produced as well and the type of nanophase utilized. Generally, a field strength of about 1 to about 10 Tesla ("T"; 1 Tesla=10,000 Gauss) and is preferably from about 2 to about 6 Tesla.

The liquid/solvent system must dissolve the additives yet permit their adsorption on the particles. A solvent blend is often used. Organic solvents are often used and blends of alcohol and another solvent such as ketone or toluene may be used. While water or another aqueous system may be used, these require longer drying times. Blends of alcohols may also be used.

Solvents useful in the present invention include water, alcohols (e.g., methanol, ethanol, propanol, butanol and mixtures thereof), trichloroethylene, ketones (e.g., methylethyl ketone, butanone and mixtures thereof), and mixtures thereof.

The slurry may be cast on any clean, smooth, impervious, insoluble surface such as MYLAR (polyester), TEFLON (polytetrafluoroethylene), or cellulose acetate. The tape carrier may be coated with a surfactant to facilitate release of the tape. The thickness of the tape varies directly with the height of the blade above the carrier, the speed of the carrier and the drying shrinkage. Casting machines are commonly up to 25 m in length, several meters in width and have speeds up to about 1500 mm/min. The tape thickness is generally from about 25 µm to about 2000 µm and preferably from about 100 µm to about 1500 µm and most preferably from about 500 µm to about 1250 µm. The tape width is generally from about 25 mm to about 1000 mm and preferably from about 100 mm to about 500 mm and most preferably from about 200 mm to about 500 mm.

Figure 7:
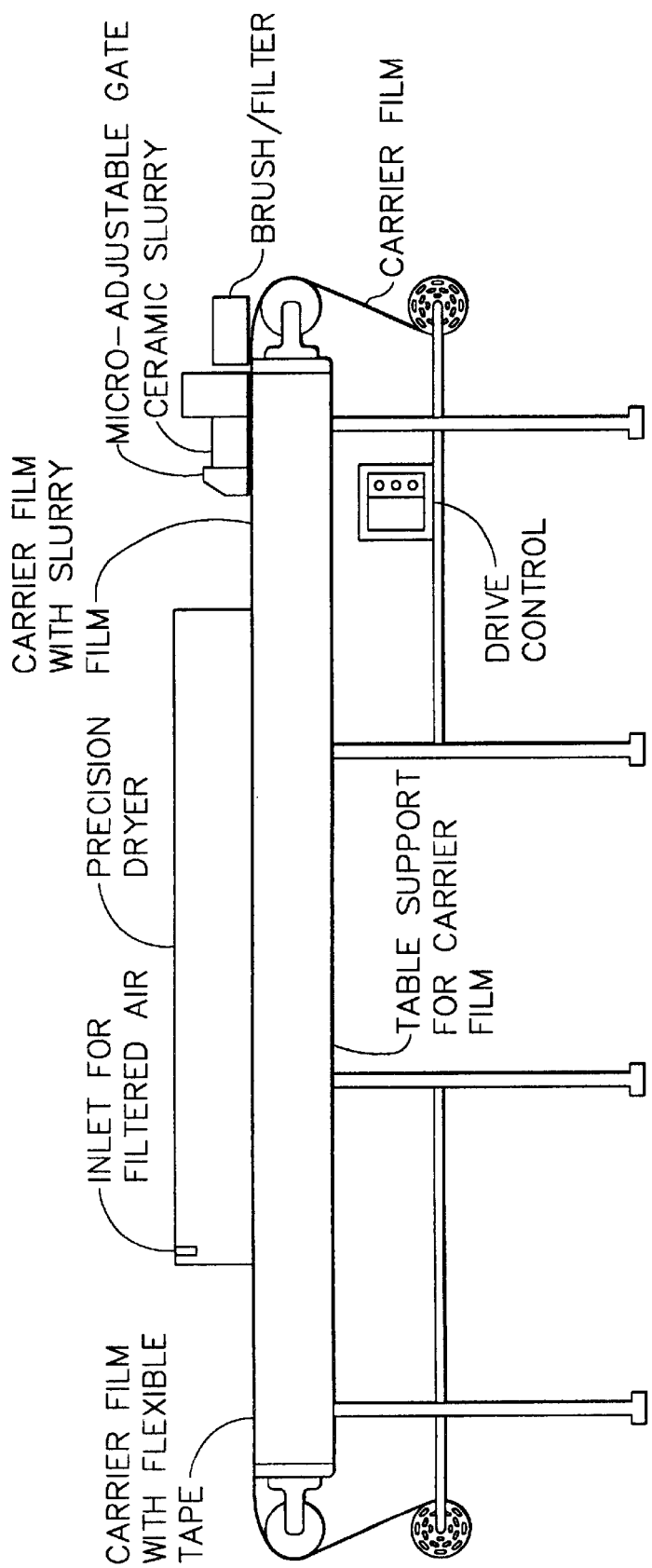
FIG. 7. Schematic diagram showing the tape casting process.
Figure 8:
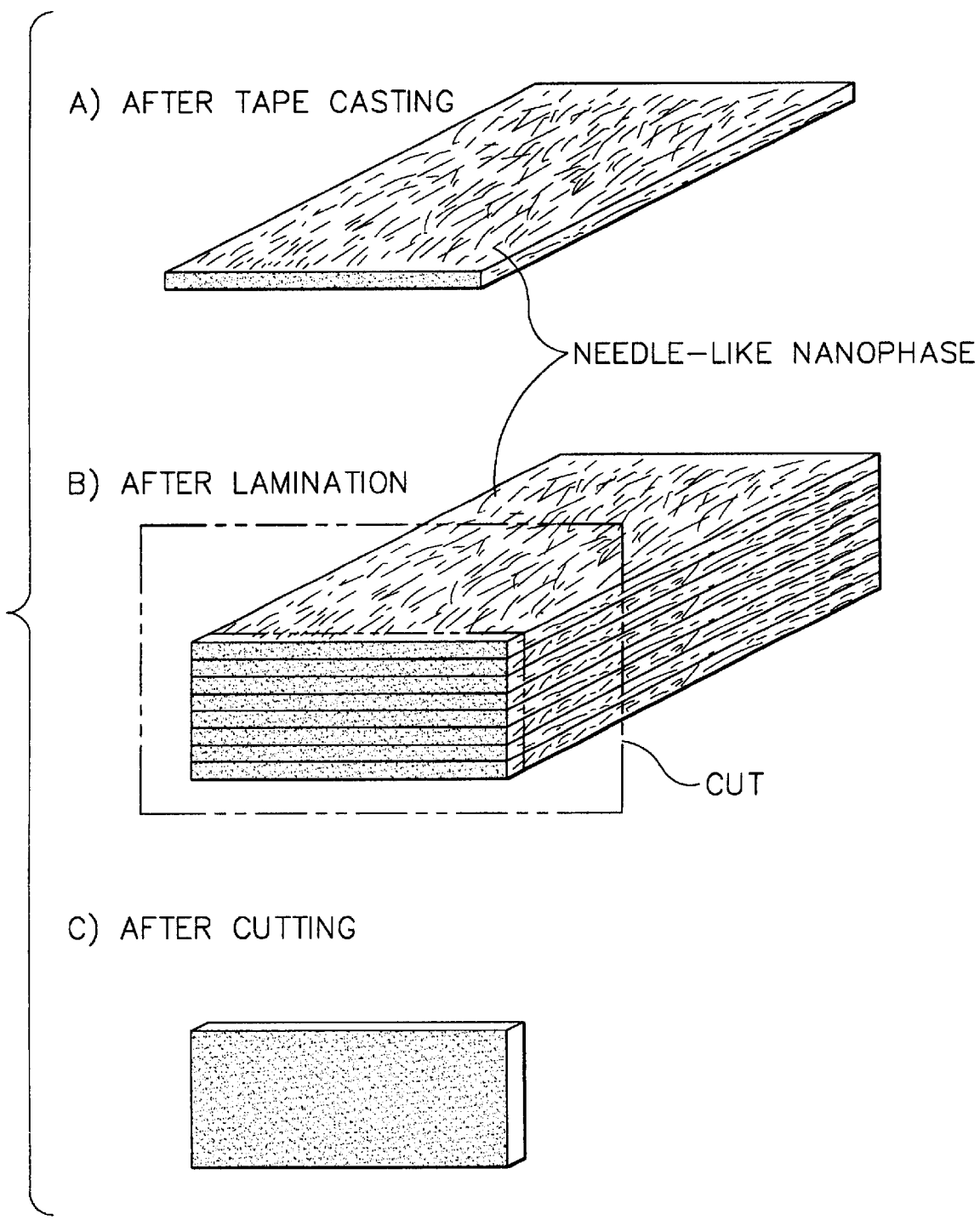
FIG. 8. Schematic diagram showing the multi-layer lamination process.

For a typical Bi2212 compound, about 68 wt. % trichloroethylene of solvent, about 6 wt. % polyvinyl butyral of binder, and about 5 wt. % sorbitan trioleate of dispersant is used. The entire tape casting process is schematically shown in FIG. 7. During tape casting, NLN falls down and thus is "textured" as a result of mechanical shear process. After drying, thin green tapes of BSCCO containing textured NLN in the matrix, but parallel to the tape surface, are obtained as shown in FIG. 8a. The dried tapes and then used directly or stored on a take-up roll or wheel.

C. Laminating and Slicing the Thin Green Sheets

One method for creating an oriented sheet of superconducting material is a so-called multi-layer lamination process (MLP).

In the MLP method, thin green sheets are made into a tape by stacking on top of each other with multi layers up to a thickness of about 2 mm to about 30 mm (see FIG. 8b) and preferably from about 5 mm to about 25 mm and most preferably from about 10 mm to about 20 mm. The laminates undergo thermopressing at temperatures between about 50° C. and about 180° C. and preferably at temperatures between about 120° C. and about 140° C. at a pressure from about 10 MPa to about 100 MPa and preferably from about 40 MPa to about 60 MPa for about 20 minutes to about 60 minutes and preferably for about 30 minutes. Laminated tape is generally from about 1% to about 10% higher in density.

The laminated tapes are then sliced at various widths as shown in FIG. 8b depending on the metal substrate size. The slices are generally from about 0.1 mm to about 10 mm thick and are preferably from about 0.5 mm to about 5 mm thick. The sliced laminates have NLN oriented normal to the large tape surface as indicated in FIG. 8c.

Slicing the materials may be by any of the methods well known in the art. Slicing methods include by diamond saws, lasers, and mechanical knives. The laminates are then placed onto the substrates and heat treated.

D. Melt-Processing Thin Sheets or MLP Laminate Slices onto a substrate

Figure 9:
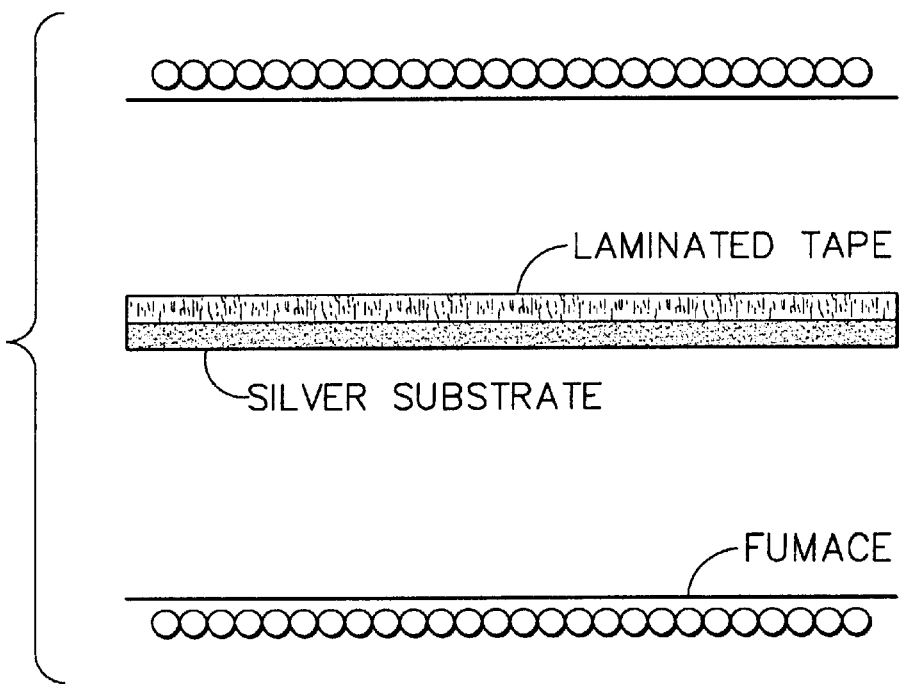
FIG. 9. Schematic diagram showing the firing of laminated tape.

The green sheets or laminate slices are placed on the surface of a substrate or cladding material for heat treatment as shown in FIG. 9. The substrate is preferably a metal such as silver, silver alloys, nickel and nickel alloys (e.g., Ag—Al, Ag—Mr, Ag—Cu, Ag—Mg, Ag—Ni, Ag—Ni—Mg, Ag—Pd, etc.) but may be any nonreactive conductor e.g., silver, gold, platinum, palladium, nickel, copper, vanadium, stainless steel and alloys and combinations thereof as well as stainless steel coated with these metals, alloys or combinations thereof The preferable substances employed within the present methodology are those atomic elements which are noble metals as a family; and constitute the metals of silver, gold, and platinum as the representative membership. Noble metals are durable and are excellent conductors of electrical current. Within the membership of this family, silver is preferred due to its minimal costs and lower softening temperature in comparison to gold or platinum. The metal is most preferably silver and silver palladium alloys.

The substrate is an integral part of the configuration. The substrate provides a normal-conducting current path in case the superconductivity is lost. In addition, in tapes and wires, the substrate also protects the brittle oxide superconductor and in films it is the supporting substrate on which the film is formed. The substrate material must not react with the oxide superconductor during heat treatment and should not oxidize.

Melt-processing, also called partial melt processing, reflects that the material melts incongruently, forming liquid and crystalline phases (i.e., a partial melt). Many different heating schedules are currently used to melt process oxide superconductors. The essential features of all are: providing an elongated article of high temperature superconductive material; providing a substrate material; applying the elongated article of high transition temperature superconductive material onto the external face of the substrate or cladding material; heating the elongated article of high transition temperature superconductive material upon the external surface of the substrate material to a temperature greater than the softening-point temperature and less than the melting-point temperature of the substrate material such that the heated substrate material softens, migrates over and bonds to the external surface of the elongated article and become only superficially embedded within the high temperature superconductive material; and allowing the heated substrate material and elongated article of high transition temperature superconductive material to cool and solidify.

In another embodiment, an elongated article made from the oriented superconductor material is coated with the substrate material to form a coated wire or tape. This method comprises the steps of providing an elongated article of high temperature superconductive material; providing a substrate or cladding material; applying the substrate or cladding material as at least one superficial coating over the external surface of the elongated article of high transition temperature superconductive material; heating the superficial coating of substrate or cladding material upon the external surface of the elongated article of high transition temperature superconductive material to a temperature greater than the softening-point temperature and less than the melting-point temperature of the substrate or cladding material such that the heated substrate or cladding material of the superficial coating soften, migrate over and superficially cover the external surface of the elongated article and become only superficially embedded within the high temperature superconductive material; and allowing the heated substrate or cladding material superficial covering on the external surface of the elongated article of high transition temperature superconductive material to cool and solidify. The substrate or cladding material is preferably a noble metal or alloy, said noble metal being selected from the group consisting of silver, gold and platinum.

In another embodiment, a plurality of substrate or cladding material coatings may be superficially applied and heated on the external surface of the elongated article of high temperature superconductive material.

It will be noted and appreciated that each member of the metal family individually has a characteristic and unique softening-point temperature as well as a melting-point temperature. It is essential to recognize the difference in properties and characteristics of each metal when warmed to its softening-point temperature in comparison to its attributes when heated to its individual melting-point temperature. When a metal is warmed to its softening-point temperature, the individual fragments of metal become pliable, malleable, mobile, and miscible. There is no liquification as such, however, at the softening-point temperature.

The temperatures and times for melt processing will vary depending upon the oxide superconductor and substrate used. For silver foils, the temperature during the heating step is generally between about 800° C. and about 930° C. and is preferably between about 890° C. and about 920° C. The heating times are generally from about 10 h to about 500 h but are preferably from about 24 h to about 200 h.

For forming the 2212 phase, the temperature of the oxide superconductor and substrate is brought to about 500° C. for about 3 hours in order to burn out the organics. The HTS and substrate is then heated to between about 890° and about 920° C. for about 30 minutes, cooled to about 840° C. at about 10° C/h and held for about 100 hours, and finally, cooled to room temperature at a rate of about 500° C/h.

The heat treatment of a thin layer of BSCCO tape onto silver substrates has been previously established by various groups (J. Kase, K. Togano, H. Kumakura, D. Dietderich, H. Irisawa, T. Morimoto, and H. Maeda, J. J. Apply. Phys. 29, 1096 (1990); H. Kumakura, K. Togano, J. Kase, T. Morimoto and H. Maeda, Cryogenics, 30, 919(1990); D. Dietdrich, B. Ullmann, H. Freyhardt, J. Kase, H. Kumakura, K. Togano, and H. Maeda, J. J. Appl. Phys. 29, 1100 (1990); J. P. Singh, D. Shi, and D. Capone, Appl. Phys. Lett. 53, 237 (1988)). Generally, for the Bi2212 phase, the temperature is brought to about 500° C. for about 3 hours to burn out the organic species. It is then heated to between about 890° C. and about 920° C. for about 30 min. for partial melting. The tape is cooled at about 10° C/h to about 840° C. and held for about 100 h. After Bi2212 grains have formed, a more rapid cooling at a rate of about 50°° C/h is used to cool down to room temperature. The formation of Bi2223 phase is more complicated, which involves a powder consisting of a mixture of phases that typically contains the Bi2212 phase. The tape is heated to between about 810° C. and about 840° C. for about 48 h and followed by a rapid cooling. Two or more heat treatment steps may be required to convert the Bi2212 to Bi2223.

A small addition of lead may also be added to promote the formation of Bi2223. Typically, lead may be added in an amount from about 0.1 wt. % to about 0.6 wt. % and preferably added in an amount from about 0.25 wt. % to about 0.4 wt. %.

Figure 10:
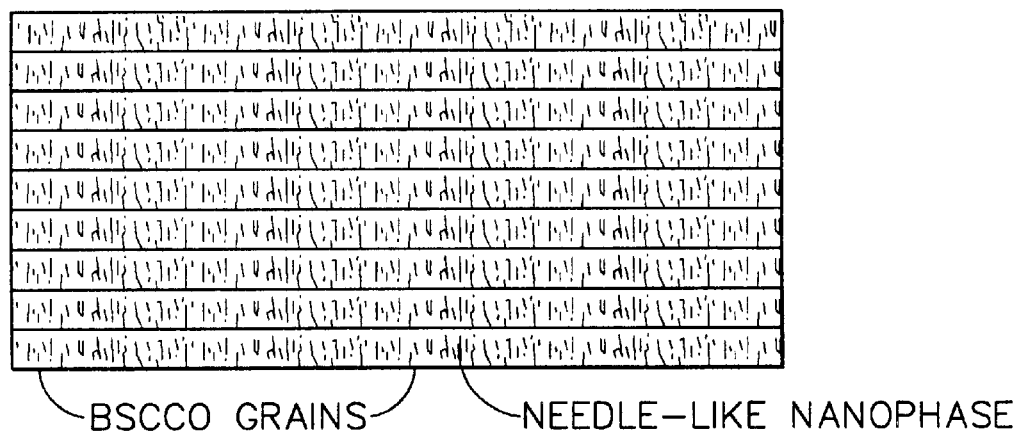
FIG. 10. Schematic diagram showing the needle-like nanophase ("NLN") strengthened micro structure for optimized 2D vortex pinning.

Upon heat-treatment, large, plate-like BSCCO grains are formed with NLN embedded vertically in the matrices of the materials as schematically shown in FIG. 10. As the field applied normal to the tape, the 2D vortices are parallel with NLN so that effective pinning can be achieved. The density of NLN is adjusted according the strength of the applied field. For an effective flux pinning, the NLN-density should be comparable to that of the 2D flux lines. The MLP method is used to introduce NLN into both Bi2212 and Bi2223 phases. In addition, magnetic alignment methods are used to texture paramagnetic nanophases. The BSCCO powders are commercially available at Superconductive Components Inc. and American Superconductors, Co.

The resulting high temperature oxide superconductor has a higher critical current than a high temperature superconductor without oriented needle-like nanophase.

E. Use of Materials Disclosed Herein

Without in any way limiting the scope of the invention it is believed that the invention provides methods whereby magnetic flux lines or planes are pinned along a more reasonable distance. Accordingly, improved results in use of a superconductor synthesized according to the invention may be obtained by using the material in an orientation in which magnetic fields are substantially parallel or, at a maximum within +/-30 degrees or less of the planes of the nanophases. This will substantially increase pinning energy without substantially increasing resistance in the superconductor. The material is also preferably oriented such that the flow of current is along planes of the defects or, at a maximum within about +/-30 degrees or less of the plane of the nanophases and substantially perpendicular to the lines of magnetic flux or, at a maximum, within about +/-30 degrees or less of the perpendicular to the flux lines.

Some major applications of superconductivity require high currents flowing through the materials. For a superconductor to be useful in the construction of high-field magnets (>10 T=100,000 Gauss), the required in-field current density, Jc(H) is on the order of $10^4$ A/cm$^2$. Although $YBa_2Cu_3O_x$ and Bi—Sr—Ca—Cu—O systems are potentially important superconductors, their commercialization has been extremely difficult as a result of the intrinsic materials characteristics. For BSCCO, the main problem is that the Jc is too low at 77 K and at even small fields (<0.5 T). Previous experiments showed that Jc(H) dropped to 1000 A/cm$^2$ at 77 K and below 0.5 T. Thus, pushing Jc up to the level of $10^4$ A/cm$^2$ has been the central task in the materials engineering of HTS. The reason for a low Jc at 77 K comes from the crystal nature of BSCCO. The physical principle is that the reduction of Jc is associated with the motion of magnetic flux lines in the superconductor. To have a high Jc, these flux lines must stay still, and any motion will cause dissipation and in turn lower Jc. For $YBa_2Cu_3O_x$, the flux lines can be quite easily pinned by crystal defects due to their 3D behavior (stands for three dimensional, 3D flux lines are elastically rigid with relatively strong line tension). Therefore, high Jc(H)'s at 77 K in these materials can be obtained. In BSCCO, however, flux lines behave 3D only in low temperatures, and they transform to 2D at relatively low temperatures and fields. A 2D flux line is like a rigid bar being cut by every insulating layer in the unit cell of BSCCO. For a given amount of pinners (defects) in the material, they may be able to effectively pin down most of the 3D flux lines due to their high rigidity and line tension. But 2D flux lines (they are often called pancakes since they are chopped into many pieces when normal to the conduction Cu—O bilayers) are difficult to pin as almost every pancake requires a pinner. An effective way to maintain a motionless flux line lattice is to create a situation where the flux line can maintain 3D. For BSCCO, the 3D to 2D crossover takes place at quite low temperatures and fields (~30 K, 2T). The key would be to increase the crossover temperature and field. Physical models have indicated that the crossover takes place as the Cu—O bilayers are decoupled by thermal activation. Therefore the coupling energy Ej of Cu—O bilayers needs to be increased. Previous studies have shown that Ej is a function o of the bilayer separation distance di. On the other hand, after decoupling of the 3D vortices, the 2D vortices are to be impeded by universal defects, which is characterized by the core pinning energy Ep. In other words, the total barrier to flux motion (E=Ej+Ep). Special defects must be introduced into the materials for an effective pinning of 2D vortices.

The present invention specifically deals with these key issues (Ep and Ej) separately based on the physical pictures of 2D vortex pinning and Josephson junction coupling of CuO conduction bilayers. To enhance Ep, the methods of the present invention process needle-like nanophases and incorporate them into the matrices of BSCCO superconductors. In this way, the 2D vortices will be effectively pinned even at higher temperatures. To raise the 2D to 3D crossover temperature, lattice distortion is required to reduce di, and in turn to increase Ej. The disclosed novel processing will, however, focus on the enhancement of Ep, and the coupling strength, Ej, will be treated in a subsequent proposal. The physical meanings of Ej and Ep are described in the next section. One of the novelties of the present invention lies in the new materials engineering of needle-like nanophases, which has great advantages over irradiation damage. Implementation of the present methods will increase Jc(H) at 77 K and the commercialization of BSCCO for many important industrial applications will be materialized.

In application, the HTSC material may be in the form of long rods of either rectangular or circular cross section. These rods are reinforced for mechanical stability and provided with low electrical resistance contacts which on one end connect to copper leads and on the other to conventional low temperature superconducting leads such as copper-clad niobium titanium.

F. Effect of Anisotropy on Flux Pinning

All high-Tc superconductors are known to be anisotropic, however, with its degree varying according to the separation between the conduction Cu—O bilayers. The consequence of high anisotropy is a flux line dimensional crossover from 3D to 2D when the vortices are perpendicular to the layers. According to Kim et al.(D. H. Kim, K. E. Gray, R. T. Kampwirth, J. C. Smith, D. S. Richeson, T. J. Marks, J. H. Kang, J. Talvacchio and M. Eddy, Physica C, 177 431 (1991)), the loss mechanism in HTS is treated as the Josephson decoupling between the superconducting Cu—O bilayers due to high anisotropy. They used an analogy between the discrete Josephson junction such as Nb—AlO—Nb, and conduction HTS Cu—O planes separated by an insulating layer. Although there are physical differences between these two processes, the result of this analogy has lead to reasonable fitting of the experimental data obtained from various HTS materials including 123, BSCCO, $TlBa_2Ca_2Cu_3O_x$, (Tl12223) and $Tl_2Ba_2Ca_2Cu_3O_x$ (Tl2223), which indicates the Josephson coupling being an important physical origin in the dissipation mechanisms of HTS. For Josephson junction of an insulating barrier in zero field (P. W. Anderson, V. Ambegaokar and B. I. Halperin, Phys. Rev. Lett. 22 1364 (1969)), the coupling energy Ej is given by $$Ej=(phD(T)/2e2Rn)tanh[D(T)/2kT], \quad (1)$$

where Rn is the normal-state junction resistance, and D(T) is the superconducting energy gap. At finite temperatures (T) and fields (B), the probability for a junction to be decoupled is given by $$P \sim exp[-Ej(B, T)/kT], \quad (2)$$

When thermal activation is comparable with the coupling energy, Ej, between the adjacent Cu—O multilayers, i.e., Ej~kT, the vortex experiences a change in its dimensionality, and the 3D to 2D crossover occurs. In the 3D situation assuming the material is isotropic, the flux line is rigid with considerable line tension. Pinning of 3D vortices can therefore be most effective by many kinds of defects including point defects of precipitates, surface defects of grain/twin boundaries, and volume defects of inclusions (D. Dew-Hughes, Philos. Mag. 30 293 (1974)). However, if we consider the HTS Cu—O layer to be coupled through Josephson junctions, the situation would be entirely different. The superconducting order parameter experiences a deep valley at the insulating layer causing week coupling between the condition layers (M. Tachiki and S. Takahashi, Appl. Super. 2 305 (1994)). Even at moderate temperature and field range, thermal fluctuation can reach the value of Ej and decouple the conduction layers. The consequence is a 3D to 2D vortices crossover, as if the original rigid, long flux fine were cut at every insulating layer and many pancakes were formed on the conduction layers (J. R. Clem, Phys. Rev. B, 9 7837 (1991); J. W. Ekin, B. Serin, and J. R. Clem, Phys. Rev. B, 9 912 (1974)). These pancakes are able to move along the conduction layers rather easily without much impedance from the pinning sites. When a pair of conduction layers become decoupled, the pancake vortices may be pinned by the universal defects such as oxygen vacancies within the layers through core pinning (K. E. Gray, R T. Kampwirth, J. M. Murduck and D. W. Capone II, Physica C, 152 445 (1988)). The interaction between a pancake vortex and a pinning center can be described by the core pinning energy Ep, $$Ep=(ax2sBc2/2m0)(1-B/Bc2)2 \quad (3)$$

where s is the c-axis repeat distance, Bs is the thermodynamic critical field, and a accounts for the loss in superconducting condensation energy of a vortex line. Therefore, for a dynamic process to occur, i.e., to initiate the motion of the vortices, two barriers must be overcome (a) the Josephson coupling energy Ej and (b) the core pinning energy Ep, thus the overall barrier preventing vortex motion can be given by $$Eoverall=2Ej+Ep \quad (4)$$

where 2Ej comes from the consideration of pinning of vortices on two conduction layers on both sides of an insulating layer. It is generally accepted that when kT becomes the order of Eoverall, vortices are driven to motion by Lorenz force, which can be characterized by a so-called irreversibility line, H*. However, caution must be taken with the physical definition of H* since its determination is instrumentation sensitivity dependent. Nonetheless, it provides a good guideline in comparison of "pinning characteristics" of a HTS material. An important finding on the pinning of a single pancake is that the Josephson coupling energy, Ej, is exponentially dependent on the Cu—O bilayer distance. Thus, a large separation between Cu—O layers results in a smaller Ej. For a highly anisotropic HTS such as BSCCO (large separation), Ej is considerably smaller (~0.05 eV) than that of 123 (relatively small separation), indicating a weakly-pinned nature in the former.

G. Effective Pinning of 2D Vortices and Enhancement of Jc in Highly Anisotropic HTS In equation (4), we see two important factors that contribute to the pinning of 2D vortices, Ej and Ep. As mentioned above, Ej is determined by the crystal anisotropy of the materials, thus pinning cannot be easily improved by manipulating microstructures during processing. The previous studies have shown that the BSCCO compounds have the lowest H* values compared to those of 123, as a result of appreciably larger separation distance between the Cu—O layers in the former. Therefore, at 77 K, for BSCCO, even small fields could drive vortices to motion causing great reduction in Jc. The strength of core pinning (characterized by Ep) relates to the intrinsic pinning sites already exist within the layers, and may be further increased by artificially introducing a high density of defects into the matrices of the materials. However, the 2D vortices may not be easily effectively pinned as in the conventional pinning of 3D vortices. As illustrated in FIG. 1, once the pancake-like vortices are formed as a result of decoupling, the pinning sites in the 3D situation are no longer effective. For a rigid 3D flux line, pinning may only require a few point defects (say three precipitates) in the neighborhood of the vortex. The analogy would be like nailing (three nails) an elastic line on the wall. The Lorenz force is unable to de-pin such an elastic line due to its rigidity and three pinners In the 2D vortices, lo however, a rigid flux line is physically disconnected at every insulating layer (it is like the elastic line being chopped into many pieces, and each piece is a pancake), and all pancakes are free to move along the conduction layers. To effectively pin down all these pancakes would require an extremely high density of point defects on almost every conduction layer. Certainly, this would make materials processing and micro structure development extremely challenging, although not entirely impossible.

H. Flux Pinning of 2D Vortices

Without wishing to be bound by theory, it is believed that the pinning of flux lines will be described. At finite temperatures and applied fields, the vortices are easily decoupled due to low values of Ej in the highly anisotropic BSCCO. Pinning of decoupled, 2D vortices is therefore the most important issue that must be dealt with before a respectable Jc(H) can be achieved at 77 K. In equation 4, we see Ep, the core pinning energy being important in the overall barrier to flux motion. The equation implies that, after the decoupling of the vortices, the 2D pancakes need to be pinned on each layer by universal pinning sites. Although the discussion on core pinning has been extensive, a few concentrated on the pinning of the 2D vortices. To describe an ideal micro structure for the strongest pinning effect, two physical pictures may be helpful in understanding the underlying mechanisms. One is the columnar defects which are arranged parallel with the 2D vortices. In this way, an array of pancake vortices along the c axis may be effectively pinned. Such a defect has been introduced by proton/ion irradiation. However, this method might not be practical in industrial applications. The second picture is a sponge-like micro structure with an extremely high density of voids in the sample matrices. It is based on a cavity pinning model (L. N. Shehata, Phys. Stat. Sol. (b) 105:77 (1981)) which is valid for defects diameter a <1, the superconducting penetration depth, and assuming that the defect is normal. According to this model, once a flux is trapped inside a cavity, a force is required to free it from the cavity. The situation would be different for another flux line which is approaching a cavity with a trapped flux line. Because of the mutual repulsion between the flux lines, the new flux line has to overcome a barrier due to repulsion before it can be trapped in the cavity. Therefore, the pinning effectiveness decreases with increasing number of flux lines trapped in the defects. Once these precipitates are saturated, they will be incapable of pinning any more flux lines. To have an effective pinning, the material must possess compatible amount of defects with the density of flux lines. For example, at 1 T, the flux density is 1011/cm$^2$ with a spacing of 500° C. It thus requires a similar density of defects to effectively pin these flux lines. In particular, the 2D vortices would require even higher and smaller defects as the core pinning has to take place at almost every Cu—O bi-layer. Conventional processing is difficult to create such a high density of pinning sites. The most effective way of approaching this ideal micro structure is through nanophases.

Nanophase materials were developed and characterized in Japan more than 30 years ago. It was first introduced to the United States in 1985 (R. W. Siegel et al., J. Mater. Res. 3, 1367 (1988)). Nanophase materials have many unique properties such as high strength, flexibility, and formability, which make them extremely attractive in industrial applications, particularly in composite materials. The nanophase processing methods include gas condensation, sol gel, and aerosol. It is well realized that some nanophase materials will react with BSCCO and thus cannot be used as suitable flux pinners. It is, therefore, preferred to use inert materials including MgO, $Al_2O_3$, $ZrO_2$, $TiO_2$, $SrTiO_3$, $LaAlO_3$, etc. as flux pinners. Some of these nanophases are commercially available.

I. Previous Results on Pinning by Nanophases

Figure 2:
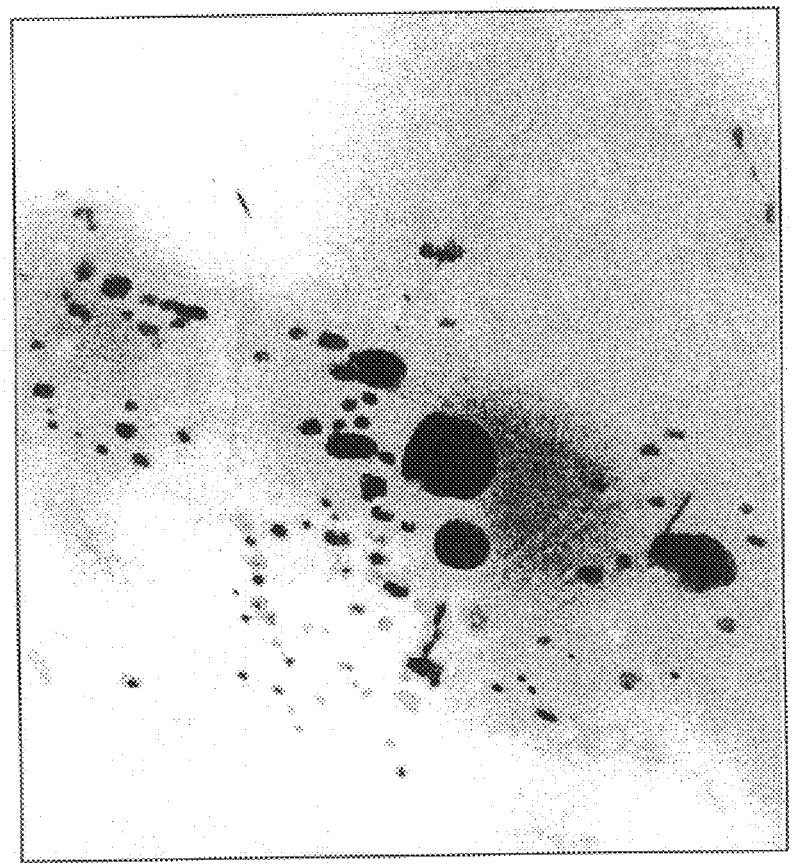
FIG. 2. Transmission Electron Microscopy ("TEM") photograph showing the fine precipitates in Bi2212 causing strong flux pinning.
Figure 3:
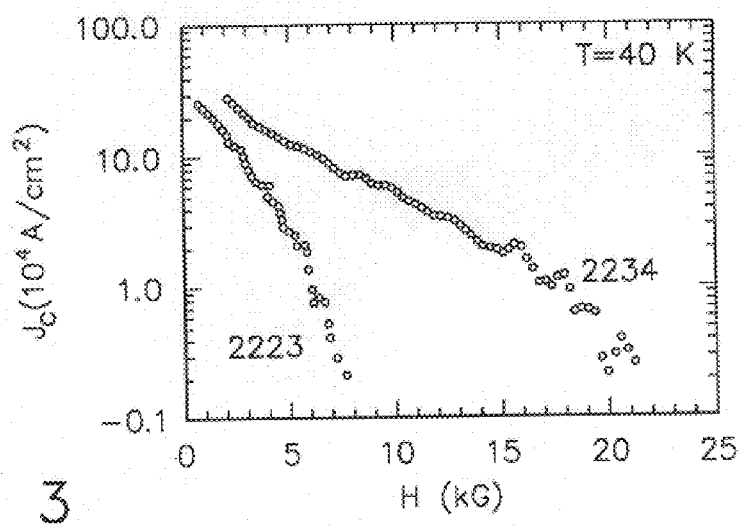
FIG. 3. Jc vs. field for both 2223 and 2234 samples. Note that the 2223 sample has few precipitates.

Earlier results have shown great progress in effective pinning in HTS by using nano-size particles. Significant attempts have already been made to increase flux pinning in BSCCO. The method was to introduce fine second phases into the matrices of the Bi2212 (D. Shi, M. Boley, U. Welp, J. Chen, Phys. Rev. B 40, 5255 (1989); D. Shi et al., Physica C, 213, 179 (1993); D. Shi et al., Phys. Rev. B 39, 9091 (1989); D. Shi, Phys. Rev. B 39, 4299 (1989)). Extremely dense glass samples with the nominal compositions of $Bi_2Sr_2CaCu_2O_x$ (2212), $Bi_2Sr_2Ca_2Cu_3O_x$ (2223), $Bi_2Sr_2Ca_3Cu_4O_x$ (2234), and $Bi_2Sr_2Ca_4Cu_5O_x$ (2245) were made by a splat-quenching method as previously described (J. Schwartz, J. K. Heuer, K. C. Goretta, R. B. Poeppel, J. Guo, and G. W. Raban Jr., Appl Super., 2, 271 (1994); K. Togano, H. Kumakura, K. Kadowaki, H. Kitaguchi, H. Maeda, J. Kase, J. Shimoyama, and K. Nomura, Adv. Cryo. Eng. 38, 1081 (1992); D. Shi, S. Sengupta, J. Luo, C. Varanasi, and P. J. McGinn,. Physica C, 213 179 (1993); K. E. Gray, Appl . Supercon., 2 295 (1994); D. Shi, M. Blank, M. Patel, D. Hinks, K. Vandervoort, and H. Claus Physica C 156, 822 (1988)). The excess calcium and copper were supersaturated in the system by complete melting and quenching. The as-quenched glass samples were subsequently annealed at 870° C. in air for various times. After annealing, it was found that, in all the 2234 and 2245 samples, there existed a large amount of calcium- and copper-rich impurity phase, which had precipitated from the amorphous matrix during the crystallization process. As shown in FIG. 2 for a 2234 sample, the precipitates are dispersed rather evenly in the sample matrix, and their dimensions vary widely from less than 0.01 mm to almost 0.10 mm. The critical current density, Jc, was found to increase by a factor of thirty at 10 K up 5 T. FIG. 3 shows the Jc values for both 2223 and 2234 samples at 40 K. These results are important evidences that Jc in BSCCO can be enhanced by nano-size precipitates at relatively high temperatures.

Figure 4:
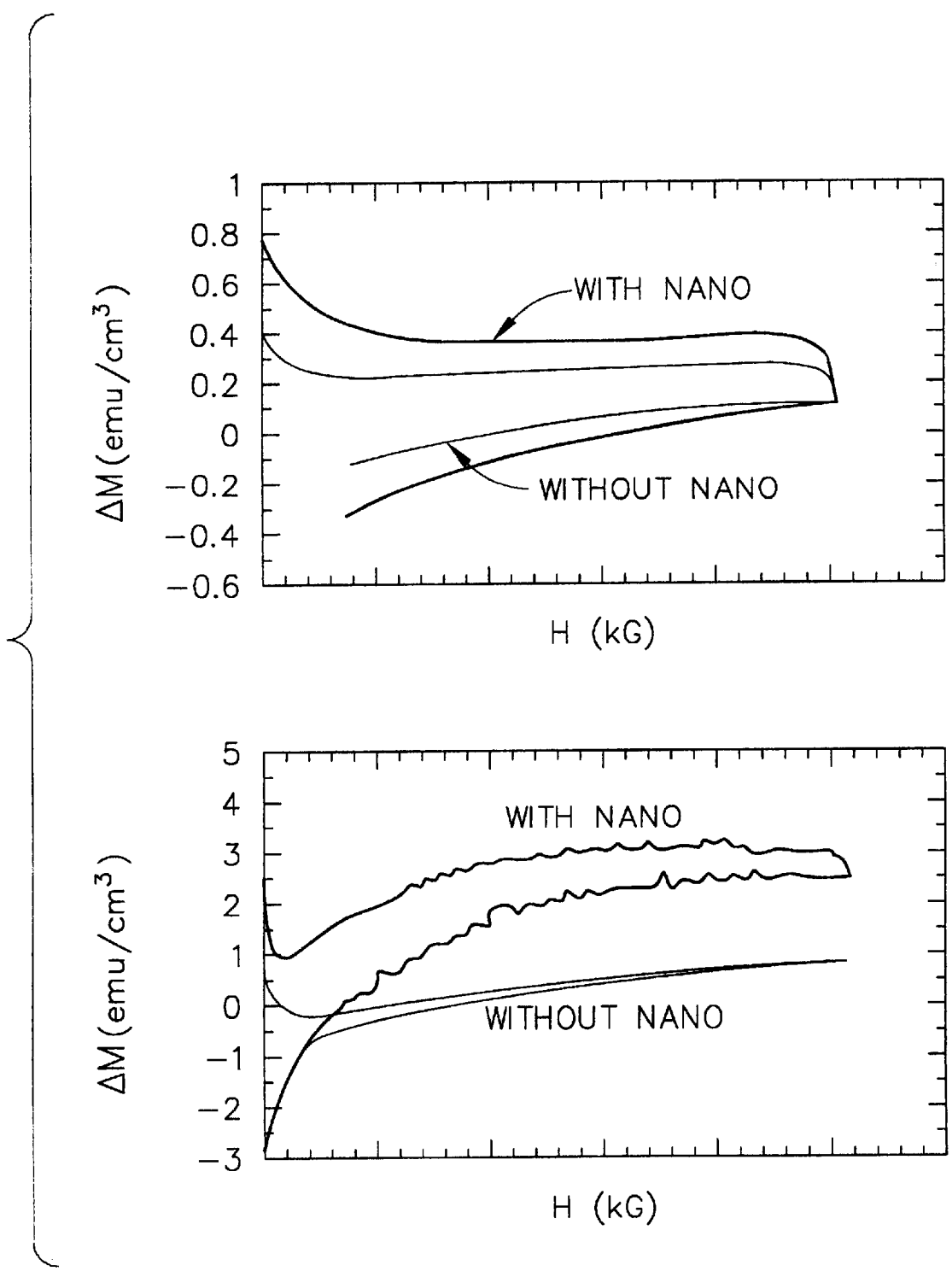
FIG. 4. M. vs. field for (a) Y123 and (b) Tl1223 with nanophases of TiO and $Al_2O_3$, respectively.

Flux pinning can also be enhanced by artificially incorporating nanophases directly into the matrices of the materials. As previously demonstrated, using nanophase $TiO_2$ and Al2O3 powders, the pinning strengths of $YBa_2Cu_3O_x$ (Y123) and $TlBa_2Ca_2Cu_3O_x$ (Tl1223) have been appreciably increased at 50 K and 35 K, respectively, as shown in FIG. 4. Note that the $TiO_2$ nanophase was added to Y123 while $Al_2O_3$ was incorporated into Tl1223. The superconductors and nanophase powders were mixed in molar ratio of 4 to 1. It has been found that no severe reaction took place in the HTS systems indicating high chemical compatibility of these nanophases.

J. Pinning by Needle-like Nanophase

Figure 5:
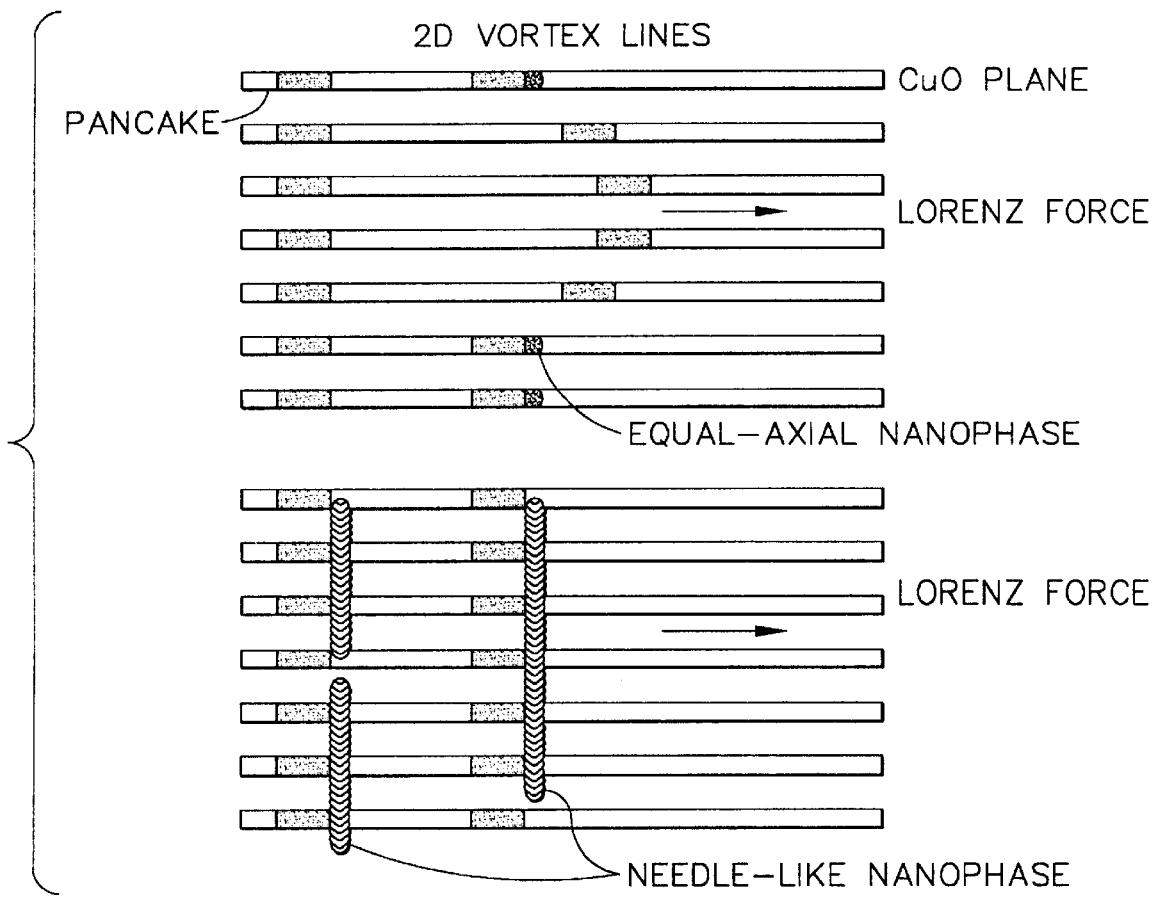
Figure 6:
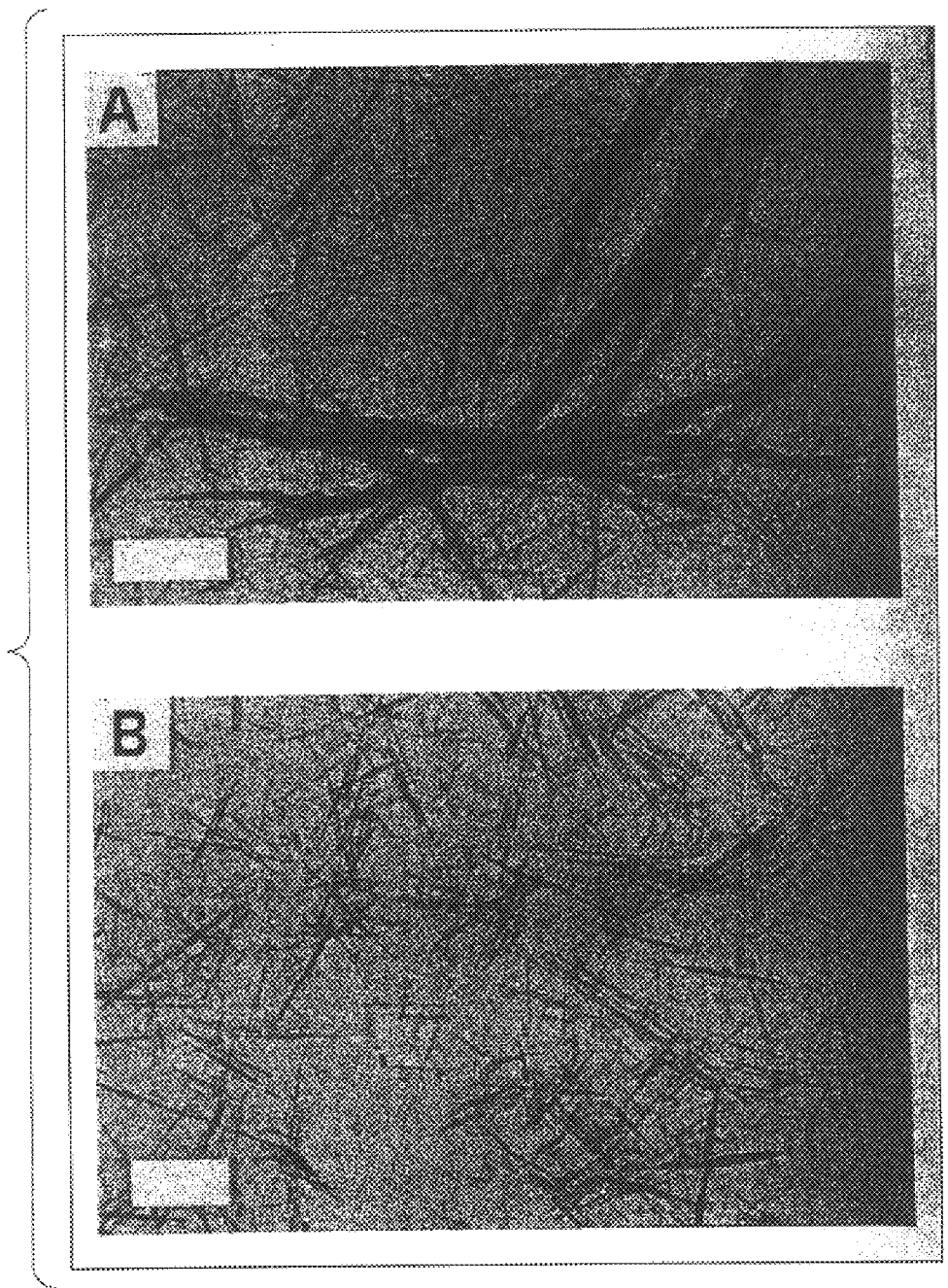

As can be seen in FIG. 2, simply using equal axial nanophase particles would not be effective particularly at high temperatures since virtually every layer has to be pinned, which is extremely difficult to achieve in materials processing. In previous studies, it was found that the Jc enhancement became difficult above 40 K by using equal axial nanophase particles. To achieve strong pinning of 2D vortices requires a high density of columnar defects, which has previously been accomplished by radiation damage (H. Safar et el., Appl. Phys. Lett. 67 130 (1995)). Problems associated with such an approach may originate from recrystallization of the defects (the columnar defects are amorphous and thus not stable) and difficulties involved in damaging a large quantity of industrial-size components (long wires and tapes). It is much more desirable, therefore, to seek for materials processing routs that can directly introduce the columnar defects. Furthermore, the introduced columnar defects should be textured and aligned with arrays of pancakes as schematically illustrated in FIG. 5. The present invention uses a viable processing route that can routinely produce nanophases with a high aspect ratio (i.e., needle-like nanophases). FIG. 6 is a transmission electron microscopy (TEM) photograph of MgO fibrils processed by a so-called hydrothermal treatment. The detailed processing procedure of needle-like nanophases is described below.

EXAMPLE

1. Synthesis of Needle-like Nanophases

The first task is to fabricate needle-like nanophases that will not react with BSCCO materials. The method described here is the hydrothermal treatment of acidified aqueous alkoxide solutions based on various high-purity magnesium alkoxide precursors (U.S. Pat. No. 2,915,475, J. Bugosh, (1959); incorporated herein in its entirety by reference). The process can be easily scaled up for mass production. The synthesis of other needle-like nanophases including pure silver and TiO are available. The alkoxide precursor used is magnesium n-propoxide [$Mg(OC_3H_7)_2$]. The precursor is dissolved in water for hydrolysis and condensation. After peptizing by adding appropriate amount of HCl, stable colloidal solutions can be formed after a slow aging process. The acidified alkoxide solutions are poured into the Teflon liners in a stainless pressure vessel. The vessel is rotated at a velocity of 6 rpm and heated at 150° C. for 20 h. The needle-shaped MgO is formed during the hydrothermal treatment. Upon removal of the alcohol produced during the treatment, the needle-like fibrils are found in the sol. These needles are examined under the TEM by spraying the sol onto a mica plate. The aspect ratio (length/width ratio) of these needles is preferably about 10. The particle dimensions and aspect ratio can be altered by using different acidified alkoxide-based solutions. For instance, the length of the needle can be increased from 100 nm to 500 nm when changing the Mg/Cl molar ratio, $Mg(OR)_3$ concentration, and type of alkoxide. The interfaces are examined by both SEM and TEM to see structural coherence and chemical bonding between the pinning sites and the matrix.

2. Alignment of Needle-like Nanophases Normal to the BSCCO Tape Surface

The second task is to arrange the needle-like nanophase ("NLN") in the matrix so that they are aligned up with the 2D vortices. This method is a so-called multi-layer lamination process (MLP). Generally, thin sheets of BSCCO containing NLN are made using conventional tape casting process. BSCCO powders are mixed with NLN by various mixing techniques. The dispersion is important since a homogeneous mix will ensure an even distribution of NLN in the matrix. Liquid DARVAN is added to the slurry for a thorough mixing of nanophases in the materials. Different mixers are used according to the viscosity of the slurry. These include impeller, flat blade turbine, ball mill, vibrator mill, and microstratifier. The degree of mixedness will be determined by various means to assess the homogeneity of the mix and the efficiency of a mixing device.

Various organic components will be used for tape casting. For a typical Bi2212 compound, we use 68 wt. % trichloroethylene of solvent, 6 wt. % polyvinyl butyral of binder, and 5 wt. % sorbitan trioleate of dispersant. The entire tape casting process is schematically shown in FIG. 7. During tape casting, NLN falls down and thus is textured as a result of mechanical shear process. After drying, thin green tapes of BSCCO containing textured NLN in the matrix, but parallel to the tape surface, are obtained as shown in FIG. 8*a*. These tapes are then stacked on top of each other with multi layers up to a thickness of from about 10 mm to about 20 mm (see FIG. 8*b*). The laminates are pressed at temperatures between 120° C. and 140° C. with 50 MPa for 30 min. They are then sliced at various widths as shown in FIG. 8*b* depending on the metal substrate size. The sliced laminates have NLN normal to the large tape surface as indicated in FIG. 8*c*. They are placed on the surface of silver tape for heat treatment as shown in FIG. 9.

3. Heat Treatment of NLN-Strengthened Tapes on Silver Substrate

The heat treatment of a thin layer of BSCCO tape onto silver substrates has been previously established by various groups (J. Kase, K. Togano, H. Kumakura, D. Dietderich, H. Irisawa, T. Morimoto, and H. Maeda, J. J. Apply. Phys. 29, 1096 (1990); H. Kumakura, K. Togano, J. Kase, T. Morimoto and H. Maeda, Cryogenics, 30, 919 (1990); D. Dietdrich, B. Ullmann, H. Freyhardt, J. Kase, H. Kumakura, K. Togano, and H. Maeda, J. J. Appl. Phys. 29, 1100 (1990); J. P. Singh, D. Shi, and D. Capone, Appl. Phys. Lett. 53, 237 (1988)). For the Bi2212 phase, the temperature is brought to about 500° C. for about 3 hours to burn out the organic species. It is then heated to between about 890° C. and about 920° C. for 30 min. for partial melting. The tape is cooled at about 10° C./h to about 840° C. and held for about 100 h. After Bi2212 grains have formed, a more rapid cooling at a rate of about 500° C/h is used to cool down to room temperature. Upon heat treatment, large, plate-like BSCCO grains are formed with NLN embedded vertically in the matrices of the materials as schematically shown in FIG. 10. As the field applied normal to the tape, the 2D vortices are parallel with NLN so that effective pinning can be achieved. The density of NLN is adjusted according the strength of the applied field. For an effective flux pinning, the NLN density should be comparable to that of the 2D flux lines. In addition, magnetic alignment methods are used to texture paramagnetic nanophases. The BSCCO powders are commercially available at Superconductive Components Inc. and American Superconductors, Co.

4. Silver Foils For Increasing Critical Current Density

Using localized -heat and preferably an indirect heat source (such as from an oven with a constant temperature or a laser or any other radiation source), start to warm the silver coating on the external surface of the superconductive material. The heating temperature should be carefully adjusted and controlled such that the temperature of the underlying superconductive material does not approach about 800° C. to about 900° C. (depending on the material) and that the external coating of silver becomes heated only to the softening-point temperature (preferably about 810° C. and about 850° C. in most instances) of the silver. Should another Noble metal other than silver be employed as the external coating, the temperature should also be carefully controlled to avoid decomposing the superconductive material; and to reach only the softening-point temperature and avoid the melting point temperature for that Noble metal.

Keep the heat of the oven (or other heat source) indirectly on the silver coating at the correct temperature, preferably at 810° C. for about 20 minutes duration. The softening silver of this external coating will begin to migrate and move along and superficially cover the external surface of the superconductive material; and only slightly penetrate the thickness and substance of the superconductive material in a very limited degree.

The heating temperature is preferably controlled and for silver is maintained between about 810° C. and about 870° C., but can be raised to about 900° C. if needed. One should take care never meaningfully to approach, much less exceed, the melting point temperature (about 960° C.) of silver. The danger in overheating and exceeding the desired temperature range is that as the temperature approaches about 960° C., the silver fragments of the external coating will quickly melt and form a metallic liquid silver droplet. Once molten silver is formed at or above about 960° C., the molten silver cannot migrate, properly cover, or become superficially embedded between the grains of the superconductive material due to its liquefied state and its larger liquid volume. Thus, all safeguards and controls as are possible should be taken and maintained such that the heating temperature for the silver of the coating never approach, much less exceed, the 960° C. temperature. There is also a danger of melting the previously annealed high Tc superconductor which may destroy its superconducting properties.

5. Critical Current Density Measurements and Flux Pinning Force Analysis

After heat treatment of the BSCCO tapes, a series of transport Jc and magnetization measurements are carried out using a 6T magnet and a vibrating sample magnetometer to study the flux pinning behaviors. These measurements are carried out on samples with various nanophase arrangements including tapes without NLN, with NLN but not textured, and with textured NLN normal to the tape surface.

(i) Pinning Force Analysis

Various flux pinning models have been proposed and studied for type II superconducting compounds (A. M. Campbell and J. E. Evetts, Adv. Phys. 21 (1972) p. 199; E. J. Kramer, J. Appl. Phys. 44 (1973) p. 1360; H. Ultmaier, Springer Tracts on Modern Phys. 76 (1975) p. 1; W. E. Yetter, D. A. Thomas, and E. 3. Kramer, Phil. Mag. 46, 523 (1982); D. Dew-Hughes, Phil. Mag. 30, 293 (1974) p. 293; W. A Fietz and W. W. Webb, Phys. Rev. 178, 657 (1969)). These models will be used to study the pinning behavior in the BSCCO system. The macroscopic parameters such as the field dependence of Jc for both B//c and B//ab in a wide temperature range from 4.2 K to 77 K will be obtained in both transport and magnetization measurements. These data will be used for a general pinning analysis based on classic flux pinning theories. According to a model proposed by Fietz and Webb (W. A. Fietz and W. W. Webb, Phys. Rev. 178, 657 (1969)), the pinning force, Fp is expressed as $Fp=Hc2n(T)f(h)$, where h=H/Hc2. In this model, the pinning mechanisms are related to the microstructures of the materials and are characterized by the value n and the form of f(h). For all type II superconductors with high upper critical field, Hc2, the pinning force density has a maximum in the Fp versus h plot. Kramer (E. J. Kramer, J. Appl. Phys. 44 (1973) p. 1360) suggested that, as a result of nonuniform pinning micro structure, some weakly pinned flux lines will be de-pinned first and shear past the ones that are still strongly pinned. Therefore, Fp should contain two competing parts which are related to the pinning force, $fp(h)=Kph1/2/(1-h)2$, and the plastic shear of the flux-line lattice, $fs(h)=Ksh1/2/(1-h)2$, where Kp=const. x Hc2Hc21/2, which is the strength of the pinning centers and Ks=2CsHc2Hc21/2, which is independent of the pinning strength, where Cs is weakly related to the pin density and applied field. The Kramer model predicts that, the maximum pinning force, Fmax, should occur at a reduced field, hp, where fp=fs. As the processing results in more and stronger pinning centers in the material (large values of Kp), the peak position of Fmax shifts to lower values of h, and the corresponding Fp values increase, and vice versa. In the Fp vs. H plots at various temperatures we observe a peak corresponding to the maximum pinning force. This peak position shifts to the lower magnetic field as the temperature is increased. We scale the field to a value (Hm) at which a peak (Fpm) in Fp takes place. This implies that we are assuming that the temperature dependence of Fp is same as that of Fpm. If there are more than one pinning centers which are dominant at different field regime one can then expect more than one maxima in Fp. Thus one is able to differentiate between the different pinning mechanisms in two samples such as the ones with and without NLN.

(ii) Irreversibility Line

We will use the Josephson junction model proposed by Kim and Gray (D. H. Kim, K. E. Gray, R. T. Kampwirth, J. C. Smith, D. S. Richeson, T. J. Marks, J. H. Kang, J. Talvacchio and M. Eddy, Physica C, 177 431 (1991), K. E. Gray, R. T. Kampwirth, J. M. Murduck and D. W. Capone II, Physica C, 152 445 (1988)) to study the coupling and 2D vortex behavior of the NLN-straightened BSCCO. In particular, we are interested in finding out the enhanced H* after the introduction of NLN in the matrices of the materials. Standard procedures in obtaining H* have been established previously (J. D. Hettinger and D. G. Steel, "High Temperature Superconducting Materials Science and Engineering, New Concepts and Technology," ed. D. Shi, Pergamon, England, P. 21–78, (1994)). According to equation (1) and (3), both Ej and Ep can be calculated based on several microscopic parameters such as Rn, $^a(T)$, s, and x, which cannot, however, be directly experimentally measured. To characterize the 2D pinning behavior, a commonly used parameter is H* which can be determined in both magnetic and transport measurement. Transport resistivity measurements are taken on various samples as a function of temperature, and use a resistivity criterion (r/m=$10^{-5}$, where rn is the temperature dependent normal state resistivity) to determine H*. The H* values for BSCCO tapes only have physical meanings in a relative term since these are polycrystaline materials with dissipation at grain boundaries. However, as a comparison, one can see differences in H* among samples with different NLN morphology and density, which will be a clear indication of enhanced coupling and pinning. These H* values are compared with those of thin films and single crystals. The H*I values of NLN strengthened-BSCCO tapes are significantly increased compared to those of pure Bi2212 and Bi2223 phases.

The foregoing is offered primarily for illustrative purposes. It will be readily apparent to those skilled in the art that substitutions, modifications and variations in the procedures and materials disclosed above may be made without departing from the spirit and scope of the invention.

What is claimed is:

1. A method for producing a high temperature oxide superconductor, the method comprising the steps of:
    (a) creating thin green sheets of superconducting material and oriented, needle-like nanophase mixture;
    (b) slicing said thin green sheets perpendicular to the surface of the thin green sheet;
    (d) placing the thin green sheet slices onto a metal substrate with the needle-like nanophases oriented normal (perpendicular) to the large surface of the metal substrate; and
    (e) heating the thin green sheet slices to partially melt the slices onto the substrate;
    the high temperature oxide superconductor produced having a higher critical current than the high temperature superconductor without the oriented needle-like nanophase.

2. The method according to claim 1, wherein said high temperature superconductor comprises materials selected from the group consisting of Re—Ba—Cu—O, Y—Ba—Cu—O, Bi—Sr—Ca—Cu—O, Ba—K—Bi—O, Tl—Ba—Ca—Cu—O, La—Sr—Cu—O and combinations thereof.

3. The method of claim 1, wherein said temperature during the heating step is between about 800° C. and about 930° C.

4. The method of claim 1 wherein said temperature during the heating step is between about 890° C. and about 920° C.

5. The method of claim 1 wherein said nanophase material is selected from the group consisting of Ag, CeO, MgO, $Al_2O_3$, $ZrO_2$, $TiO_2$, $SrTiO_3$, $LaAlO_3$, AgO, TiO, $Y_2BaCuO_5$, $BaCuO_2$, CuO, $Cu_2O$, and mixtures thereof.

6. The method of claim 1 wherein said sheet is heated for a period of between about 1 and about 100 hours.

7. The method of claim 1 wherein the needle-like nanophase of said thin green sheets are oriented by placing said thin green sheets in a magnetic field such that magnetic flux is substantially perpendicular to said parallel a-b planes of the said thin green sheets.

8. A method for producing a high temperature oxide superconductor, the method comprising the steps of:
    (a) creating thin green sheets of superconducting material and oriented, needle-like nanophase mixture
    (b) laminating a plurality of said thin green sheets
    (c) slicing said laminate of thin green sheets perpendicular to the surface of the thin sheet laminate
    (d) placing the thin sheet laminate slices onto a substrate with the needle-like nanophases oriented normal to the large surface of the sheet
    (e) heating the thin sheet laminate slices to partially melt the laminate onto the substrate the high temperature oxide superconductor having a higher critical current than the high temperature superconductor without the oriented needle-like nanophase.

* * * * *